United States Patent
Suzuki et al.

(10) Patent No.: US 6,202,188 B1
(45) Date of Patent: Mar. 13, 2001

(54) DATA TRANSMISSION DEVICE

(75) Inventors: Takashi Suzuki; Toshio Miki, both of Yokohama; Tomoyuki Ohya; Toshiro Kawahara, both of Yokosuka; Satoru Adachi, Yokohama, all of (JP)

(73) Assignee: NTT Mobile Communication Network Inc. (JP)

( * ) Notice: Subject to any disclaimer, the term of this patent is extended or adjusted under 35 U.S.C. 154(b) by 0 days.

(21) Appl. No.: 08/887,410

(22) Filed: Jul. 2, 1997

(30) Foreign Application Priority Data

Jul. 19, 1996 (JP) .................................................. 8-191186
Jul. 19, 1996 (JP) .................................................. 8-191187
Jul. 19, 1996 (JP) .................................................. 8-191188
Nov. 6, 1996 (JP) .................................................. 8-294141

(51) Int. Cl.$^7$ ................................................. H03M 13/29
(52) U.S. Cl. ............................................................ 714/758
(58) Field of Search .................................. 714/758, 776

(56) References Cited

U.S. PATENT DOCUMENTS 5,416,787    5/1995    Kodama et al. ..................... 371/43

FOREIGN PATENT DOCUMENTS

| | | |
|---|---|---|
| 2068159 | 1/1993 | (CA) . |
| 2131674 | 3/1995 | (CA) . |
| 0551646 | 7/1993 | (EP) . |
| 0680034 | 1/1995 | (EP) . |
| 0712219 | 5/1996 | (EP) . |
| 5175853 | 7/1993 | (JP) . |

OTHER PUBLICATIONS

McAuley, A., "Reliable Broadband Communication using a Burst Erasure Correcting Code", SIGCOMM '90, pp. 297–306, Sep. 1990.*

Shacham, N., "Multipoint Communication by Hierarchically Encoded Data", INFOCOM '92, pp. 2107–2114, Dec. 1992.*

Ng., W., "Adaptive ARQ using Complementary Coding and Signal Editing", MILCOM '92, pp. 589–593, Dec. 1992.*

Merel, D., et al., "An Adaptive Half Duplex Data Transmission FEC/ARQ Procedure: Results on Real HF Ionospheric Channel", IEE Conf., HF Radio Systems and Techniques, Jul. 1994, pp. 197–201.*

* cited by examiner

Primary Examiner—Stephen M. Baker
(74) Attorney, Agent, or Firm—Brinks Hofer Gilson & Lione

(57) ABSTRACT

A data transmission device comprises a transmitter device and a receiver device. The transmitter device divides a data string to be transmitted into an original data string requiring protection against code error and a data string requiring no protection. The transmitter device then carries out an error detection code adding operation and error correction coding at a redundancy code rate of 1/N on the original data string to generate a coded data string. The transmitter device divides the coded data string by N, and outputs the N divided coded data strings and the data string requiring no protection on a communication line under a time division multiplexing control. The receiver device receives the N coded data strings and the data string requiring no protection. The receiver device carries out error correction decoding on the N divided coded data strings and a mixed coded data string obtained by mixing the divided coded data strings, and carries out error detection on decoded data strings obtained by the decoding. The receiver device then outputs one of the decoded data strings from which no code error is detected together with the data string requiring no protection. The data transmission device can carry out a data transmission protecting the transmitted data from burst code errors and random code errors without increase of redundancy.

34 Claims, 22 Drawing Sheets

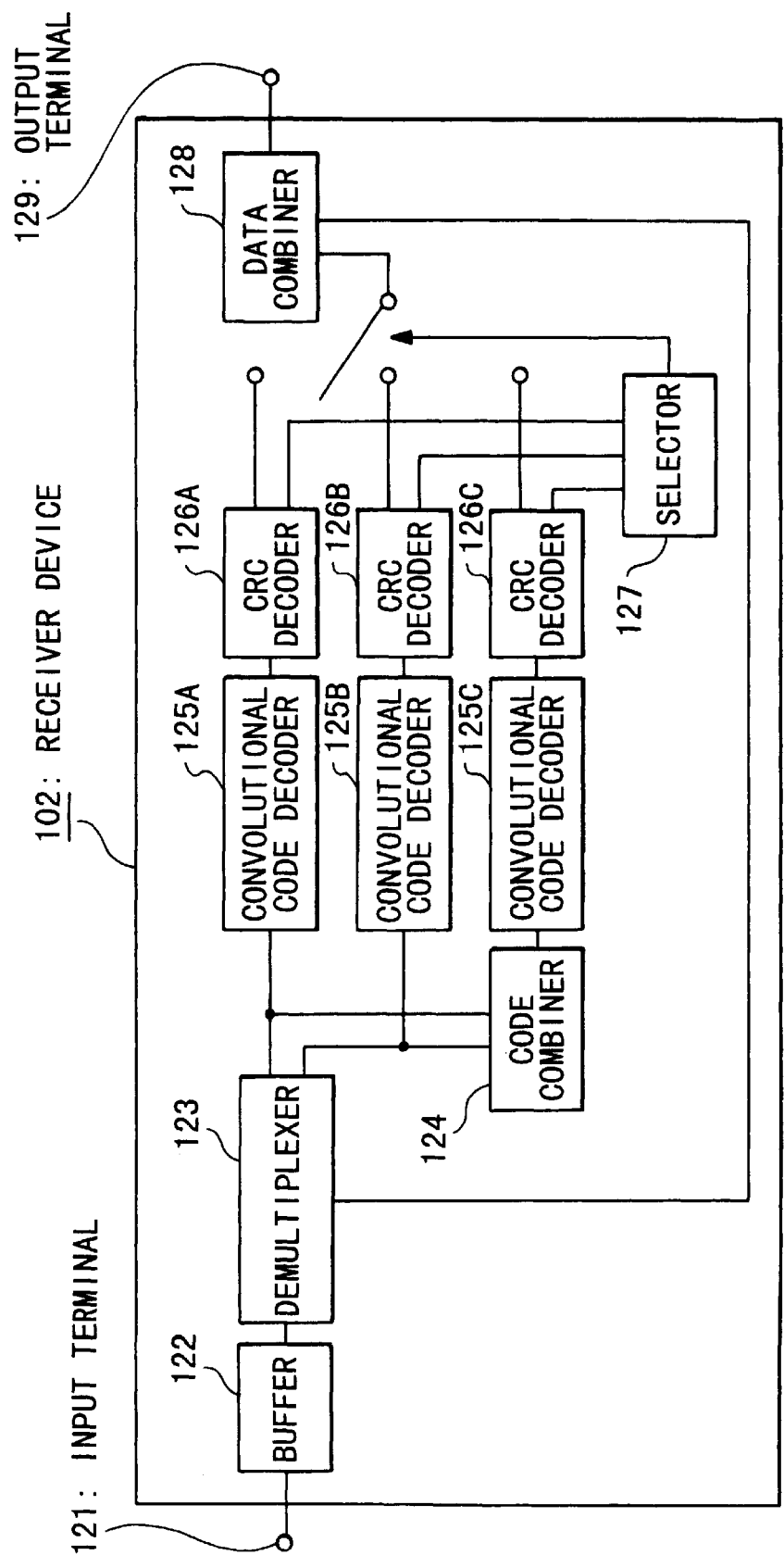

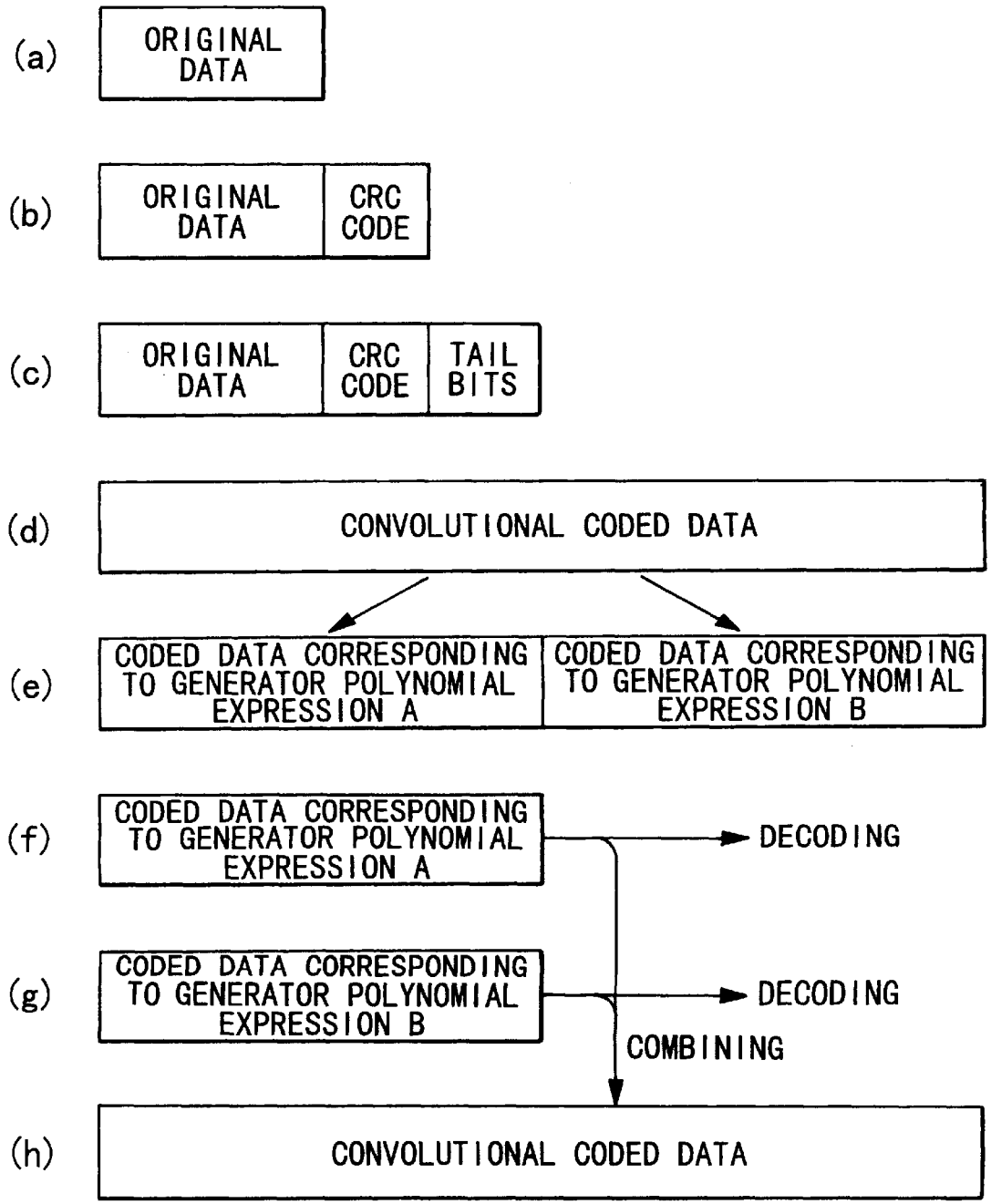

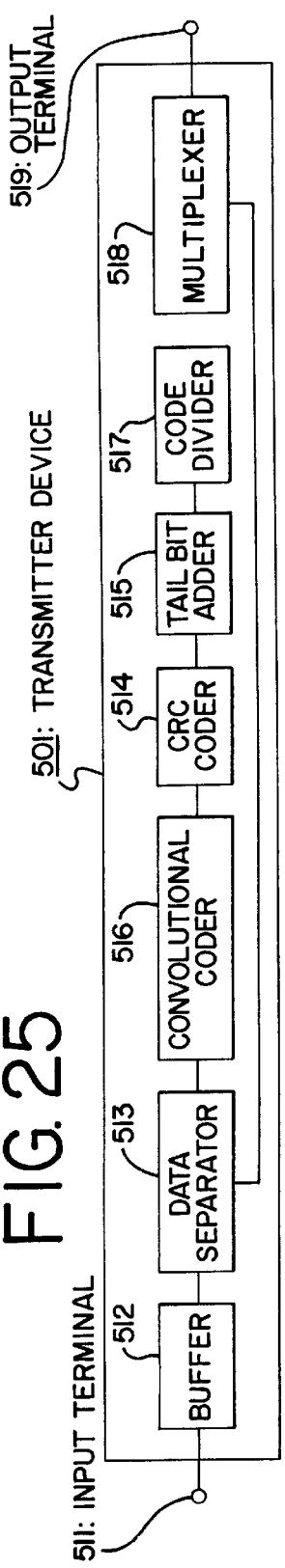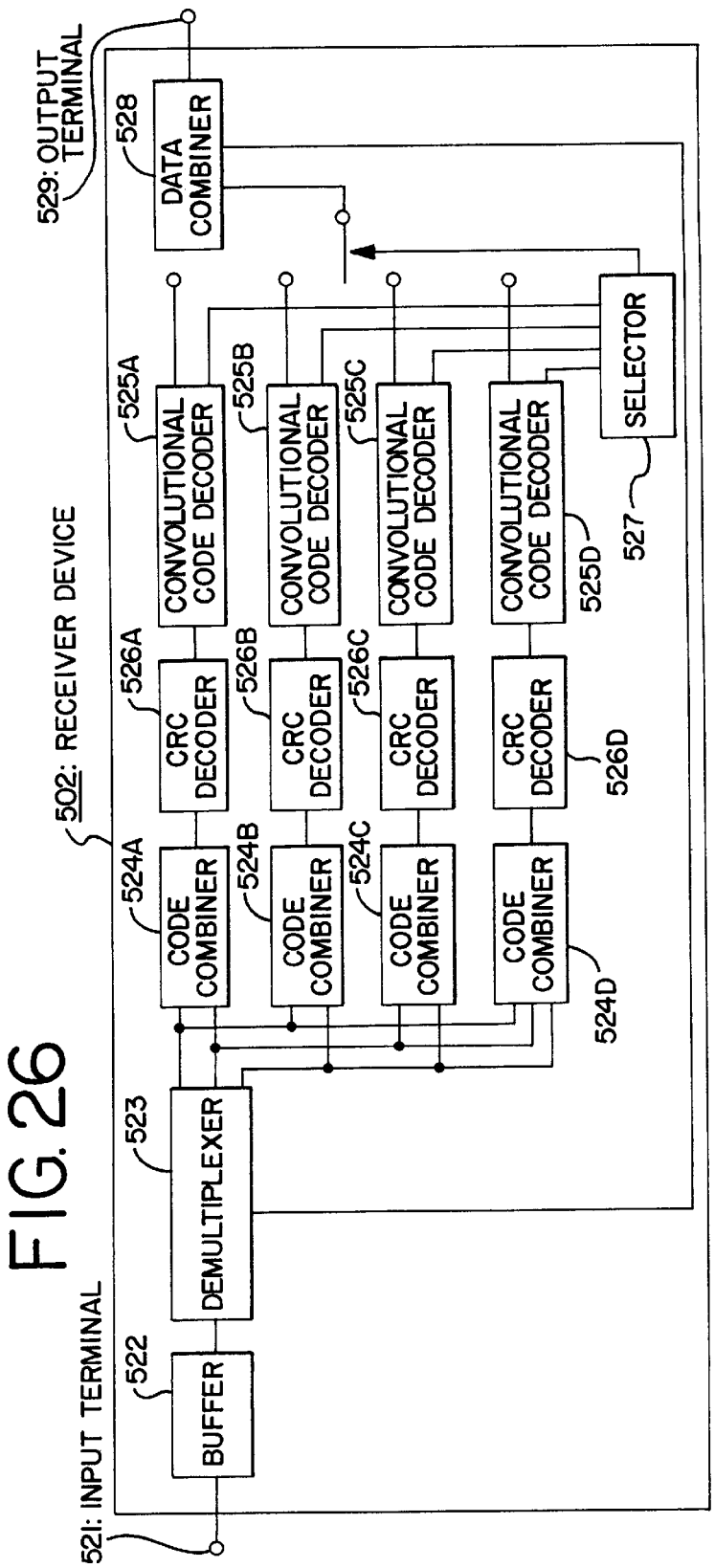
FIG. 25
FIG. 26

DATA TRANSMISSION DEVICE

BACKGROUND OF THE INVENTION

1. Field of the Invention

The present invention relates to a data transmission device suitable for data transmission in a communication environment in which code errors easily occur.

2. Background Art

In data transmission using a communication line in which code errors easily occur, a data lack or a miss receiving due to code errors often occurs in a receiver device and this deteriorates quality of receiving. In order to overcome this problem, technical means such as a retransmission control method or an error correction decoding is used. These technical means are disclosed in detail, for example, in a printed material written by Shu Lin and Daniel J. Costello under the heading of "Error Control Coding Fundamentals and Applications" Prentice Hall 1983.

A retransmission control method is a method in which a transmitter device transmits duplicate data in response to a receiving error report from a receiver device. The retransmission control method is significantly effective to a data communication in which many code errors occur at a burst. However, the retransmission control method requires a reverse channel through which the receiver device sends the receiving error report to the transmitter device, and therefore the method cannot be used in data transmission devices having no reverse channel.

Error correction coding is a method in which a receiver device corrects code errors of received data and therefore the method does not require any reverse channel. However, there is a case in which many code errors occur at a burst in a communication line and the code errors exceed the error correction ability. In such a case, a part of the code errors are not corrected in the error correction decoding and some code errors are remained in the decoded data. In order to reduce the remaining error, use of interleave is expected. However, when using interleave in data transmission, error correction ability corresponding to the number of code errors which are expected to be included in a section on which the interleave is carried out. Therefore, a very high redundancy is necessary for the error correction coding. Furthermore, when a heavy burst error exceeding the error correction ability occurs in a part of a section on which the interleave is carried out, it is impossible to correctly decode the all received data even if the other part of the section includes no code error.

In order to protect transmitted data from code errors without using reverse channel, a method in which a data and a error detection code added to the data are repeatedly transmitted at discrete plural times is expected as an effective method. In this method, the receiver device receives same data at plural discrete times, and the receiver device carries out error detection on the all received data, which are the same data if having no code error, and decodes one of the received data from which no code error is detected.

The conventional data transmission methods are as described above. In the conventional art, it is quite difficult to provide an effective data transmission in which transmitted data can be protected from burst code errors and random code errors without use of reverse channel. The reason is more specifically described as follows:

In order to protect transmitted data from burst code errors, it may be effective to use the above-described method to transmit same data at plural discrete times.

When same data are transmitted at plural times according to the method, a part of the data may be transmitted to the receiver device with no code error. Therefore, if such a data having no code error can be transmitted and the data thus transmitted is decoded, it is possible to prevent that the transmission quality is degraded by a data lacking due to code errors.

In some cases, however, random code errors occur in the all data which are discretely transmitted at plural times according to the above method. In such cases, the receiver device can detect the code errors of the all received data because the all data have the error detection codes. However, the receiver device cannot correct the code errors. Therefore, in this case, a data having no code error is not obtained in the receiver device at all even if each received data include little random code error.

In order to overcome this problem, an method in which error correction coding is carried out on all data discretely transmitted at plural times and the errors of the data are corrected in the receiver device, is expected. However, if this method is used, a very high redundancy is required to obtain enough error correction ability. The use of the method to duplicately transmit same data deteriorates the transmission efficiency to some extent. However, the use of error correction coding deteriorates the transmission efficiency to more heavy extent, and therefore the transmission efficiency is significantly deteriorated.

Furthermore, this method has a problem that the control of the redundancy requires control of frequency at which same data are transmitted and there is no method except for the method controlling frequency, and therefore the method lacks flexibility of redundancy adjustment in that the redundancy can be adjusted to only integrals of that of the original data.

SUMMARY OF THE INVENTION

In the consideration of the above, it is a first object of the present invention to provide a data transmission device which can carry out data transmission protecting the transmitted data against code error occurring at a burst and code error occurring at a random with no increase of redundancy of coding. It is a second object of the present invention to provide a data transmission device which can achieve the first object and can transmit data at a desired redundancy which may be a redundancy defined by noninteger number.

From one aspect of the present invention, therefore, there is provided a data transmission device comprising a transmitter device for carrying out error correction coding on an original data, which is to be transmitted, to generate a coded data, and for dividing the coded data, and for outputting the divided coded data on a communication line; and a receiver device for receiving the divided coded data through the communication line, and for carrying out error correction decoding using the divided coded data or a mixed coded data obtained by mixing the divided coded data to generate a plurality of decoded data, and for selecting one of the decoded data which is expected to have no code error or to have a least remaining code error, and for outputting the selected decoded data.

According to the present invention, data transmission can be carried out protecting the transmitted data from burst error and random error without an excessive high redundancy of coding.

The present invention further provides a data transmission device comprising a transmitter device for carrying out error detection code adding operation and error correction coding at a redundancy 1/N on an original data, which is to be transmitted, to generate a coded data, and for dividing the coded data by N, and for outputting the N divided coded data on a communication line; and a receiver device for receiving the N divided coded data through the communication line, and for carrying out error correction decoding and code error detection on the N divided coded data and a mixed coded data obtained by mixing the divided coded data to generate a plurality of decoded data, and for outputting one of the decoded data from which no code error is detected.

Furthermore, the present invention provides a data transmission device comprising a transmitter device for carrying out error correction coding at a redundancy 1/N by convolution on an original data, which is to be transmitted, to generate a convolutional coded data, and for dividing the coded data by N, and for outputting the N divided coded data on a communication line; and a receiver device for receiving the N divided coded data, and for carrying out error correction decoding on the N divided coded data to generate decoded data, and for detecting code errors of the decoded data by comparing tail bits included in the decoded data with tail bits which are used in generation of the convolutional coded data, and for carrying out error correction coding by a Viterbi decoding on a mixed coded data obtained by mixing the N divided coded data, and for detecting code error of a decoded data obtained by the error correction decoding by comparing a metric of a remaining path calculated in the error correction decoding, and for outputting one of the decoded data from which no code error is detected.

Furthermore, the present invention provides a data transmission device comprising a transmitter device for carrying out error detection code adding operation and error correction coding at a redundancy 1/N on an original data, which is to be transmitted, to generate a coded data, and for dividing the coded data by M which is less than N, and for outputting the M divided coded data on a communication line; and a receiver device for receiving the M divided coded data through the communication line, and for carrying out error correction decoding and code error detection on the M divided coded data and a mixed coded data obtained by mixing the divided coded data to generate a plurality of decoded data, and for outputting one of the decoded data from which no code error is detected.

According to the present invention, data transmission can be carried out at a desired redundancy which may be a redundancy defined by non-integer number.

The present invention further provides a data transmission device comprising a transmitter device for carrying out error correction coding at a redundancy 1/N by convolution on an original data, which is to be transmitted, to generate a convolutional coded data, and for dividing the coded data by M which is less than N, and for outputting the M divided coded data on a communication line; and a receiver device for receiving the M divided coded data, and for carrying out error correction decoding on the M divided coded data to generate decoded data, and for detecting code errors of the decoded data by comparing tail bits included in the decoded data with tail bits which are used in generation of the convolutional coded data, and for carrying out error correction coding by a Viterbi decoding on a mixed coded data obtained by mixing the M divided coded data, and for detecting code error of a decoded data obtained by the error correction decoding by comparing a metric of a remaining path calculated in the error correction decoding, and for outputting one of the decoded data from which no code error is detected.

The resent invention further provides a data transmission device comprising a transmitter device for carrying out error detection code adding operation and error correction coding on an original data, which is to be transmitted, to generate a coded data, and for dividing the coded data into a plurality of coded data having a code length shorter than the original data, and for outputting the divided coded data on a communication line; and a receiver device for receiving the divided coded data through the communication line, and for mixing the divided code data to generate a plurality of mixed coded data having a code length which is equal to or longer than the code length of the original data which has not had the error correction coding, and for carrying out error correction decoding on the mixed coded data to generate decoded data and carrying out error detection of the decoded data, and for outputting one of the decoded data from which no code error is detected.

The present invention further provides a data transmission device comprising a transmitter device for carrying out error correction coding on an original data, which is to be transmitted, to generate a coded data, and for dividing the coded data into a plurality of punctured convolutional codes, and for outputting the punctured convolutional codes on a communication line; and a receiver device for receiving the punctured convolutional codes through the communication line, and for mixing the punctured convolutional codes to generate a plurality of coded data having a code length equal to or longer than a code length of the original data, and for carrying out a Viterbi decoding on the coded data, and for carrying out code error detection of decoded data obtained by the Viterbi decoding by comparing metrics of remaining paths calculated in the Viterbi decoding with a predetermined reference value, and for outputting one of the decoded data from which no code error is detected.

The present invention further provides a data transmission device comprising a transmitter device for carrying out error correction coding on an original data, which is to be transmitted, to generate a coded data, and for assuming a burst length of a burst error caused in a communication line, and for selecting one of a plurality of methods for dividing a coded data into coded data having a code length which is different by method based on the assumed coded data, and for dividing the coded data obtained by the error correction coding into a plurality of coded data according to the selected method, and for outputting the divided coded data and an identification data indicating the selected method on the communication line; and a receiver device for receiving the divided decoded data and the identification data through the communication line, and for judging the method which is used in order to obtain the divided coded data in the transmitter device based on the identification data, and for carrying out error correction decoding on the divided decoded data or on a mixed decoded data which is obtained by mixing the divided coded data and has a code length longer than a code length of the original data which has not had the error correction coding based on the judgement, and for selecting one of decoded data obtained by the error correction decoding which is expected to have no code error or a least remaining code error, and for outputting the selected decoded data.

According to the present invention, the optimum method for dividing the coded data is selected based on the burst error appearance condition of the communication line, and therefore coding transmission having a high quality can be carried out in every condition.

The data transmission devices as described above may be modified so that the transmitter device dividing a data to be transmitted into an original data requiring protection against code error and a data requiring no protection, and carrying out the operation for obtaining the divided coded data on the data requiring protection, and transmits the divided coded data on the communication line multiplexing with the data requiring no protection, and the receiver device receiving the divided coded data and the data requiring no protection, and carrying out the operation for obtaining the decoded data on the coded data, and outputs the coded data together with the data requiring no protection.

The order of the error detection code adding operation and the error correction coding of the transmitter device may be alternated and the operation of the receiver device may be changed so as to conform with the operation of the transmitter device.

The coded data may be divided into not only coded data having a same code length but also coded data having different code lengths.

BRIEF DESCRIPTION OF THE DRAWINGS

FIG. 2 is a block diagram showing the configuration of a receiver device of the data transmission device according to the first preferred embodiment.

FIG. 3 shows an example of data transmitted from the transmitter device.

FIG. 4 shows data processing carried out in some sections of the transmitter device and of the receiver device.

FIG. 25 is a block diagram of an alternate configuration of the embodiment shown in FIG. 12.

FIG. 26 is a block diagram of an alternate configuration of the embodiment shown in FIG. 13.

DETAILED DESCRIPTION OF THE PREFERRED EMBODIMENTS

A. First Preferred Embodiment

At the outset, it is to be noted that the term "a data", as used herein, is to be interpreted as "a data string". Similar terms used herein, such as "a coded data", "two data", and the like, are to be interpreted similarly.

Figure 1:
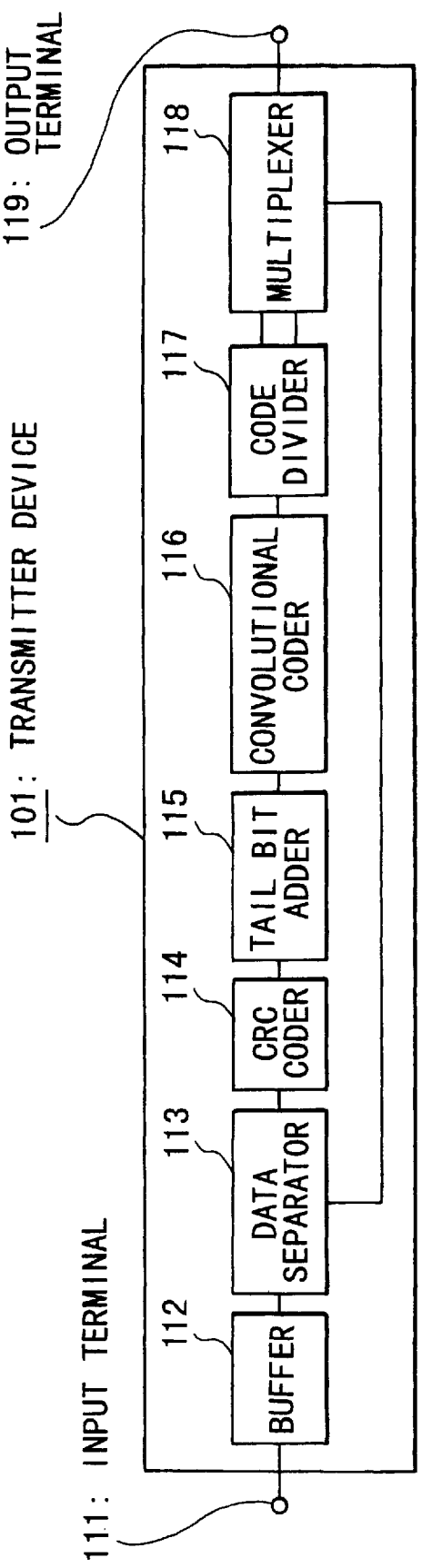
FIG. 1 is a block diagram showing the configuration of a transmitter device of a data transmission device according to a first preferred embodiment of the present invention.

FIG. 1 is a block diagram showing the configuration of a transmitter device 101 of a data transmission device according to a first preferred embodiment of the present invention. FIG. 2 is a block diagram showing the configuration of a receiver device 102 of the data transmission device. FIG. 3 shows an example of data transmitted from the transmitter device 101. FIG. 4 shows data processing carried out in some sections of the transmitter device 101 and of the receiver device 102.

First of all, the description will be given with respect to the transmitter device 101. A data inputted through an input terminal 111 is sent to a data separator 113 via a buffer 112 coding unit by coding unit. The data separator 113 divides the data from the buffer 112 into a data requiring protection against code error and a data not requiring protection. The data separator 113 then supplies the data requiring protection to a CRC coder 114 as an original data and supplies the data not requiring protection to a multiplexer 118. The illustration (a) of FIG. 4 shows the original data supplied to the CRC coder 114.

Some methods may be used for dividing transmitted data into a data requiring protection and a data not requiring protection are to be determined. For example, in transmission of data and audio signals in a time division multiplexing system, there is expected a method in which the data is treated as data requiring protection and the audio signal is treated as data not requiring protection. In the case where data and audio signal are transmitted in a predetermined pattern, the data separator 113 may be designed so as to divide the data and the audio signal supplied from the buffer 112 according to the pattern. In transmission of hierarchical data such as image coded data, a method to treat header information of the data as data requiring protection and to treat the other information as data not requiring protection may be used. In this case, it is possible to discriminate the header part of the data from the other part according to the coding syntax of the data. Therefore, this case assumes that the transmitter device has a data separator having a property for interpreting the coding syntax.

The CRC coder 114 adds a CRC (Cyclic Redundancy Check) code to the original data supplied from the data separator 113, as shown in the illustration (b) of FIG. 4. A tail bit adder 115 adds tail bits to the output data of the CRC coder 114 to terminate convolutional coding, and outputs a data including the original data, the CRC code and the tail bits, as shown in the illustration (c) of FIG. 4. The tail bits have bit length corresponding to restrictional length of convolutional decoding carried out by a convolutional coder 116 which is provided in the output side of the tail bit adder 115.

The convolutional coder 116 is means for carrying out error correction coding at a code rate of ½ on the data supplied from the tail bit adder 115. More specifically, the convolutional coder 116 in the preferred embodiment is to carry out convolution on the data supplied from the tail bit adder 115, and outputs a convolutional coded data having a redundancy code rate of ½ as shown in the illustration (d) of FIG. 4.

A code divider 117 divides the convolutional coded data by two. Some methods are expected with respect to the dividing operation. In a method of the preferred embodiment, the code divider 117 divides the convolutional coded data supplied from the convolutional coder 116 into two parts which respectively correspond to two generation polynomial expressions. That is to say, if the convolutional coder 116 carries out convolution using generation polynomial expressions A and B, the code divider 117 divides the convolutional coded data supplied from the convolutional coder into a part corresponding to the expression A and a part corresponding to the expression B, as shown in the illustration (e) of FIG. 4.

The multiplexer 118 multiplexes the coded data which correspond to the generation polynomial expressions A and B and are outputted from the code divider 117, and the data not requiring protection outputted from the data separator 113. The multiplexer 118 then outputs a data thus multiplexed to a communication line via an output terminal 119. The multiplexing is carried out so that the data not requiring protection is inserted between the coded data corresponding to the generation polynomial expressions A and B as shown in FIG. 3, and the coded data are separated from each other in a time axis not so as to meet a same burst error.

Next, the description will be given with respect to the receiver device 102. The data outputted from the transmitter device 101 as described above is transmitted to an input terminal 121 of the receiver device 102. The data thus transmitted is supplied to a demultiplexer 123 via a buffer 122 decoding unit by decoding unit and the data is divided into the two coded data and the data not requiring protection by the demultiplexer 123. The data not requiring protection is sent to a data mixer or data combiner 128. In the two coded data, one corresponds to the generation polynomial expression A and the other corresponds to the generation polynomial expression B. The coded data corresponding to the generation polynomial expression A is sent to a convolutional code decoder 125A. The coded data corresponding to the generation polynomial expression B is sent to a convolutional code decoder 125B. Furthermore, the two coded data corresponding to the generation polynomial expressions A and B are sent to a code mixer or code combiner 124.

The convolutional code decoder 125A carries out decoding corresponding to the generation polynomial expression A on the coded data sent from the demultiplexer 123, and then generates a decoded data corresponding to the original data, which has not had the convolution using the generation polynomial expression A, as shown in the illustration (f) of FIG. 4 (f). A CRC decoder 126A carries out code error detection on the decoded data based on the CRC code included in the decoded data.

Similarly, the convolutional code decoder 125B carries out decoding corresponding to the generation polynomial expression B on the coded data sent from the demultiplexer 123 to generate a decoded data, as shown in the illustration (g) of FIG. 4. A CRC decoder 126B carries out code error detection on the decoded data based on the CRC code included in the decoded data.

On the other hand, the code mixer 124 mixes the coded data corresponding to the generation polynomial expressions A and B to generate a coded data corresponding to the convolutional coded data which has not had division by the code divider 117 of the transmitter device 101, as shown in the illustrations (f)–(h) of FIG. 4. A convolutional code decoder 125C carries out decoding on the coded data generated by the code mixer 124 to generate a decoded data corresponding to the original data which has not had convolution, as shown in the illustration (h) of FIG. 4. A CRC decoder 126C carries out code error detection on the decoded data based on the CRC code included in the decoded data.

The results of code error detection of the CRC decoders 126A–126C are sent to a selector 127. The selector 127 selects one of the decoded data which is expected to have no code error or to have a least remaining code error based on the results of code error detection. More specifically, the selection is carried out according to the following method:

a. If the coded data outputted from the convolutional code decoder 125A–125C includes a coded data from which no code error is detected, the selector 127 selects such a decoded data having no code error and sends it to the data mixer 128.

b. If code errors are detected from all of the decoded data outputted from the convolutional code decoders 125A–125C, the selector 127 selects the decoded data outputted from the convolutional code decoder 125C and sends it to the data mixer 128. Because, the decoded data outputted from the convolutional code decoder 125C is obtained from the coded data having a redundancy code rate of ½ by error correction decoding and it is expected that the remaining error is less than the remaining errors of the other decoded data.

The data mixer 128 multiplexes the decoded data selected by the selector 127 and the data not requiring protection sent from the demultiplexer 123. The data mixer 128 outputs the demeltiplexed data via an output terminal 129 as a decoded data. If the decoded data and the data not requiring protection are to be used by different external devices, the decoded data and the data not requiring protection may be supplied to the external devices via different output terminals.

As described above, the two coded data are sent at discrete times from the transmitter device to the receiver device and the decoded data is obtained from these coded data in the preferred embodiment. Therefore, it is possible to reduce the probability that no decoded data is obtained due to code error having a relative long remaining time such as burst error.

Furthermore, the coded data capable of error correction is generated from the two coded data and the decoding is carried out using the coded data thus generated in the preferred embodiment. Therefore, even if random errors are included in the two coded data, the random errors can be corrected.

Furthermore, the two coded data are transmitted, putting the data not requiring protection therebetween. Therefore, it is possible to reduce the probability that the two coded data meet a same burst error and to make a good use of the communication line.

The first preferred embodiment is as described above, but the range of the present invention is not restricted to the range of the preferred embodiment. There are some modifications of the above-described first preferred embodiment, for example, as follows:

(1) The selector 127 may be designed so as to not only select the decoded data from which no code error is detected, but compare the decoded data in order to reduce the mis-detection of the CRC decoders using the comparison result. More specifically, the selector 127 of this modification checks the results of error detection and compares the decoded data. In the check and the comparison when plural decoded data, from which no code error are detected, are recognized and the decoded data are different from each other, or when a decoded data, from which a code error is detected, corresponds to other decoded data, from which no code error is detected, the selector 127 judges that the no error detection may be due to mis-detection of the CRC decoder.

(2) The above-described preferred embodiment discloses the example in which the transmitter device carries out error correction coding at a redundancy code rate of $I/N=\frac{1}{2}$ and transmits the two coded data which are obtained by dividing the coded data into two parts. That is to say, the above-described preferred embodiment discloses the example of the present invention corresponding to N=2. However, it is obviously understood that the preferred embodiment may be modified so as to correspond to other values of N.

(3) The above-described preferred embodiment discloses the example in which the coded data is divided into the two coded data and the two coded data are transmitted. Therefore, in this disclosed example, the code mixer 124 generates a coded data capable of error correction using the two coded data, i.e., the all coded data transmitted from the transmitter device 101. However, in the modified example corresponding to N being at least three, the code mixer 124 may select plural coded data among the all coded data transmitted from the transmitter device 101, and generate a coded data capable of error correction using the selected coded data. In another modified example, the code mixer 124 may generate plural coded data capable of error correction using the code data transmitted from the transmitter device 101.

(4) The above-described preferred embodiment discloses the example in which the coded data is divided into the two coded data having a same code length. This example may be modified so that a coded data generated by error correction coding at a redundancy code rate of 1/N is divided into M (N>M) coded data which have different code lengths, and the M coded data are transmitted. For example, if error correction coding at a redundancy code rate of ⅓ is carried out, the coded data generated by the coding is divided into a longer coded data having a twice code length of the original data and a shorter coded data having a code length equal to that of the original data, and the two coded data are transmitted from the transmitter device. In this case, if the longer data includes a code error, the code error can be corrected only using the coded data. Therefore, in the receiver device, error correction decoding is carried out on the longer coded data. The shorter coded data may be decoded when the code error of the longer coded data is a burst error and cannot be corrected. In this modification, priorities can be assigned to the divided coded data in the transmission and the decoding.

Figure 21:
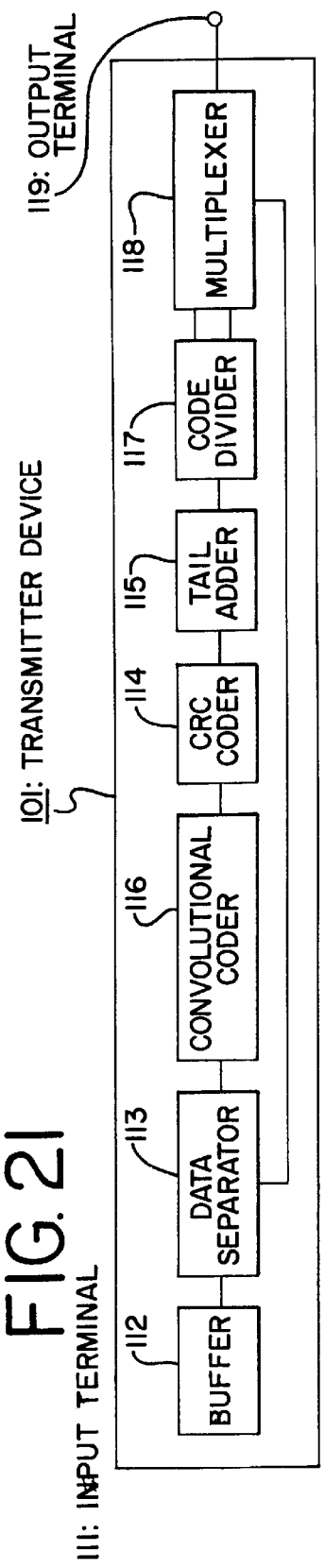
FIG. 21 is a block diagram of an alternate configuration of the embodiment shown in FIG. 1.
Figure 22:
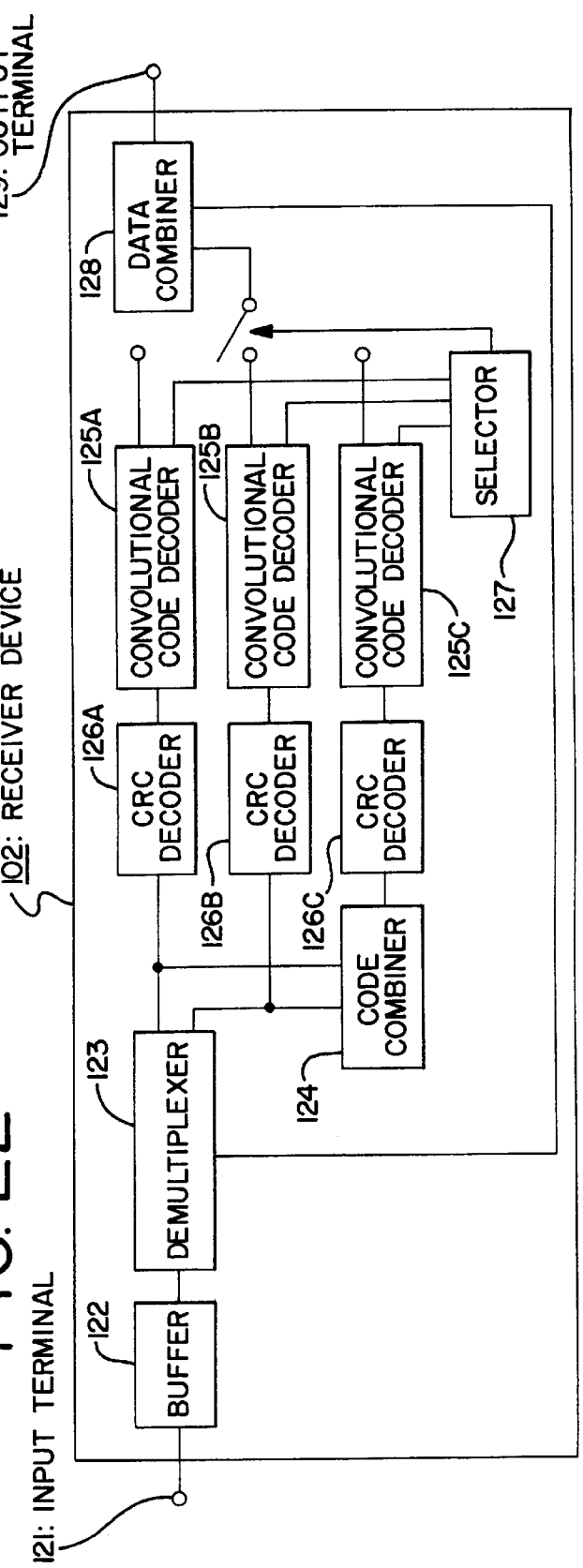
FIG. 22 is a block diagram of an alternate configuration of the embodiment shown in FIG. 2.

(5) In the above-described preferred embodiment, the CRC coder 114 is placed in front of the convolutional coder 116. As shown in FIGS. 21 and 22, this embodiment may be modified so that the CRC coder is placed on the output side of the code divider and CRC codes are added to the two coded data obtained from the code divider. In this modification, the error detections of the two coded data are carried out based on the CRC codes included in the coded data in the receiver device.

If no error is detected from any coded data, decoding is carried out on such a coded data. If errors are detected from the all coded data, error correction coding is carried out on a coded data which is obtained by mixing the plural coded data. In this modification, quantity of operation is reduced in comparison to the case in which error correction coding of a mixed coded data is always carried out.

(6) In the above-described preferred embodiment, convolutional coding is used as error correction coding. However, the error correction coding used in the present invention is not restricted to convolutional coding. For example, invertible coding, disclosed in a printed material written by Shu Lin and Daniel J. Costello, Jr. under the heading of "Error Control Coding Fundamentals and Applications" (Prentice Hall 1983) may be used as error correction coding in the present invention.

Generally, convolutional decoding using a generation polynomial expression, which is used in the transmitter device of the above-described preferred embodiment, is to convert an original data to a coded data, the content of which is different from that of the original data.

In contrast, invertible coding is to convert an original data to a coded data which includes the original data. Therefore, if the invertible coding is used in the transmitter device of the modification, the original data is transmitted as one of the divided coded data.

(7) The tail bit adder 115 maybe omitted from the above-described preferred embodiment if a relatively low error correction ability is required with respect to the bits placed in the vicinity of the terminal portion of the data requiring protection. In this case, the redundancy corresponding to the tail bit can be rejected.

B. Second Preferred Embodiment

Figure 5:
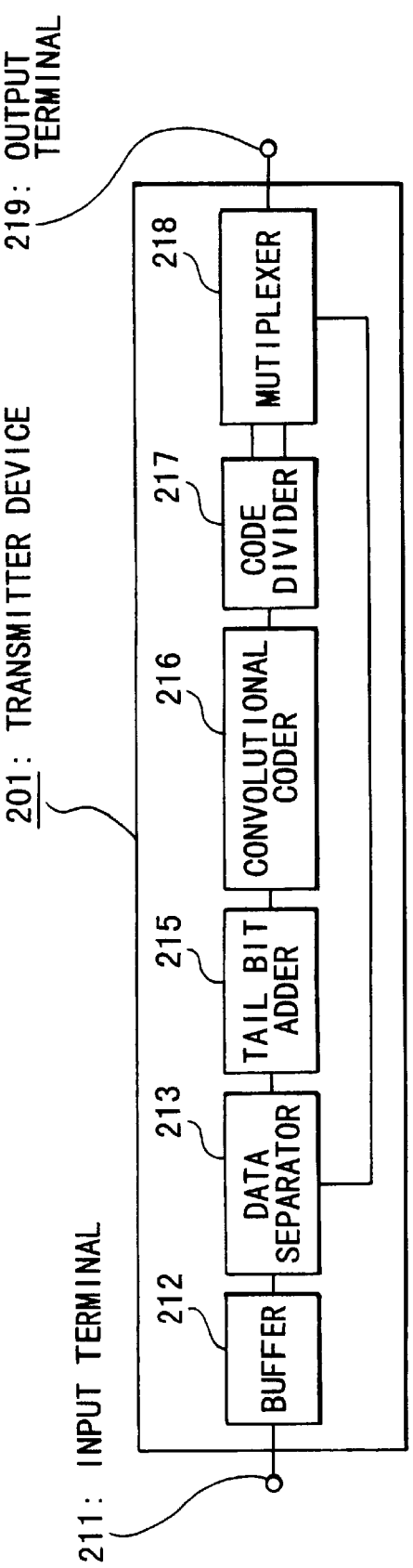
FIG. 5 is a block diagram showing the configuration of a transmitter device of a data transmission device according to a second preferred embodiment of the present invention.
Figure 6:
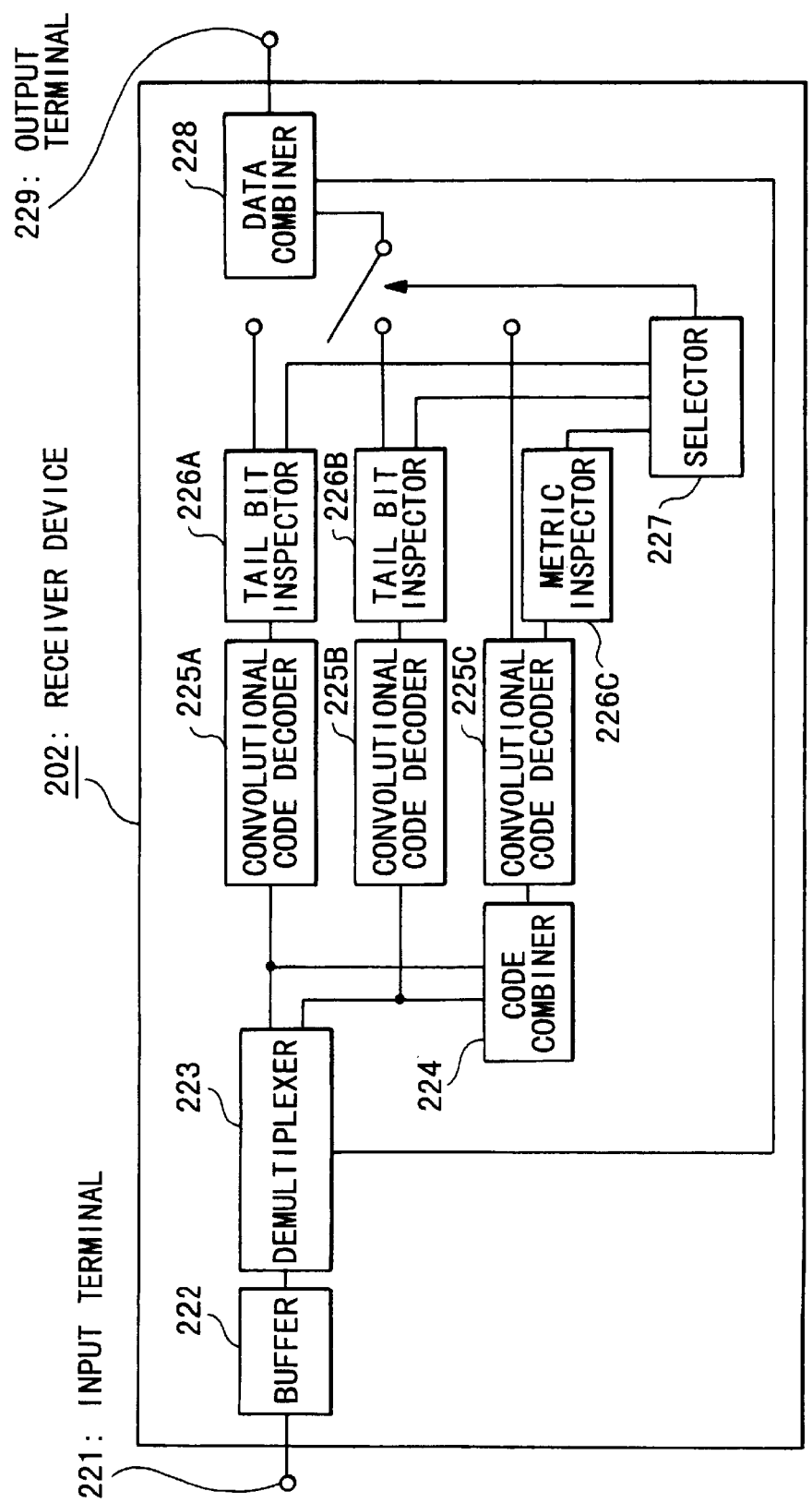
FIG. 6 is a block diagram showing the configuration of a receiver device of the data transmission device according to the second preferred embodiment.

FIG. 5 is a block diagram showing the configuration of a transmitter device 201 of a data transmission device according to a second preferred embodiment of the present invention. FIG. 6 is a block diagram showing the configuration of a receiver device 202 of the data transmission device.

As shown in FIG. 5, the transmitter device 201 is made up of an input terminal 211, a buffer 212, a data separator 213, a tail bit adder 215, a convolutional coder 216, a code divider 217, a multiplexer 218 and an output terminal 219. In the above-described first preferred embodiment, the transmitter device 101 is designed so that the original data outputted from the data separator 113 is added with a CRC code by the CRC coder 114 and the original data having the CRC code is supplied to the tail bit adder 115. In the transmitter device 201 of the second preferred embodiment, the original data outputted from the data separator 213 is directly supplied to the tail bit adder 215. The other elements of the configuration of the transmitter device 201 of the second preferred embodiment are the same as the configuration of the transmitter device 101 of the first preferred embodiment. In the transmitter device 201, the coded data corresponding to the generation polynomial expressions A and B are generated, and the two coded data and a data requiring no protection are multiplexed so that the two coded data are separated in a time axis and the data requiring no protection is put therebetween. The data thus multiplexed is transmitted to a communication line.

Next, the description will be given with respect to the receiver device 202. The data transmitted from the transmitter device 201 is transmitted to an input terminal 221 of the receiver device 202 via the communication line. This data is supplied to a demultiplexer 223 decoding unit by decoding unit via a buffer 222, and the data thus supplied is divided into the two coded data and the data requiring no protection. The data requiring no protection is supplied from the demultiplexer 223 to a data mixer or data combiner 228. On the other hand, the two coded data, which are protected against code error, are respectively supplied to convolutional code decoders 225A and 225B. Furthermore, the two coded data are supplied to a code mixer or code combiner 224.

The convolutional code decoder 225A carries out decoding corresponding to the generation polynomial expression A on the coded data which is supplied from the demultiplexer 223 to generate a decoded data corresponding to the original data which has not had convolution using the generation polynomial expression A. The decoded data thus generated is supplied to a tail bit inspector 226A. The tail bit inspector 226A compares tail bits which are added in the convolutional code generation with tail bits included in the decoded data to judge whether or not the decoded data has a code error. Similarly, the convolutional code decoder 225B carries out decoding corresponding to the generation polynomial expression B on the coded data supplied from the demultiplexer 223, and a tail bit inspector 226B carries out code error detection on a decoded data outputted from the convolutional code decoder 225B by comparison of tail bits.

On the other hand, the code mixer 224 mixes the coded data corresponding to the generation polynomial expressions A and B to generate a coded data corresponding to the original coded data which has not had division. A convolutional code decoder 225C carries out a Viterbi decoding on the coded data generated by the code mixer 224 to generate a decoded data corresponding to the original data which has not had convolutional coding. A metric inspector 226C compares a metric of remaining path, which is calculated in the decoding by the convolutional code decoder 225C, with a predetermined reference value to carry out error detection of the decoded data generated by the convolutional code decoder 225C.

A selector 227 selects one of the decoded data which is expected to have no code error or a least remaining code error based on the results of code error detection of the tail bit inspectors 226A and 226B, and of the metric inspector 226C. More specifically, the selection is carried out according to the following method:

a. If the decoded data outputted from the convolutional code decoders 225A–225C include a decoded data from which no code error is detected, the selector 227 select such a decoded data having no code error and sends it to the data mixer 228.

b. If code errors are detected from all of the decoded data outputted from the convolutional code decoders 225A–225C, the selector 227 selects the decoded data outputted from the convolutional code decoder 225C and sends it to the data mixer 228, because it is expected that the remaining error of this decoded data is the least.

The data mixer 228 multiplexes the decoded data selected by the selector 227 and the data requiring no protection sent from the demultiplexer 223, and outputs the data thus multiplexed as a decoded data via an output terminal 229.

As described above, error detection of the decoded data is carried out using the tails added in the error correction coding and the metric calculated in the error correction decoding.

Therefore, it is not necessary to add a redundancy bit to the coded data for error detection. Thus, the redundancy of transmission can be reduced.

In the above-described preferred embodiment, error detection of the decoded data is carried out by the tail bit inspectors and the metric inspector without use of the other additional information except for the tail bit. However, this embodiment may be modified so that other error detection code, such as a CRC code, is also used. This modification can improve the accuracy of error detection. Furthermore, the above-described second preferred embodiment may be modified by applying the modifications corresponding to the modifications (1)–(4) of the first preferred embodiment.

C. Third Preferred Embodiment

Figure 7:
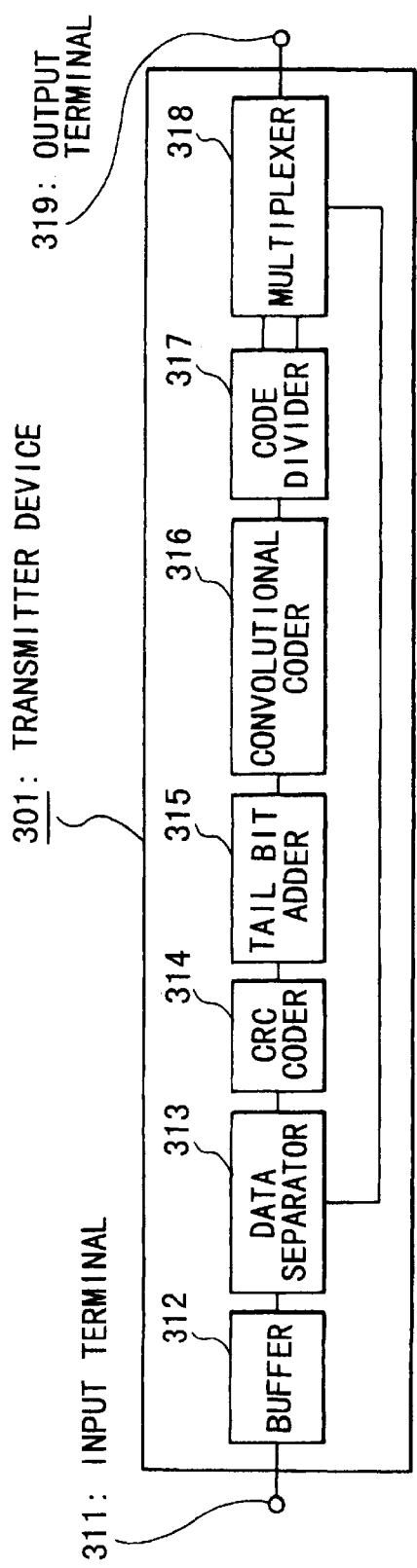
FIG. 7 is a block diagram showing the configuration of a transmitter device of a data transmission device according to a third preferred embodiment of the present invention.
Figure 8:
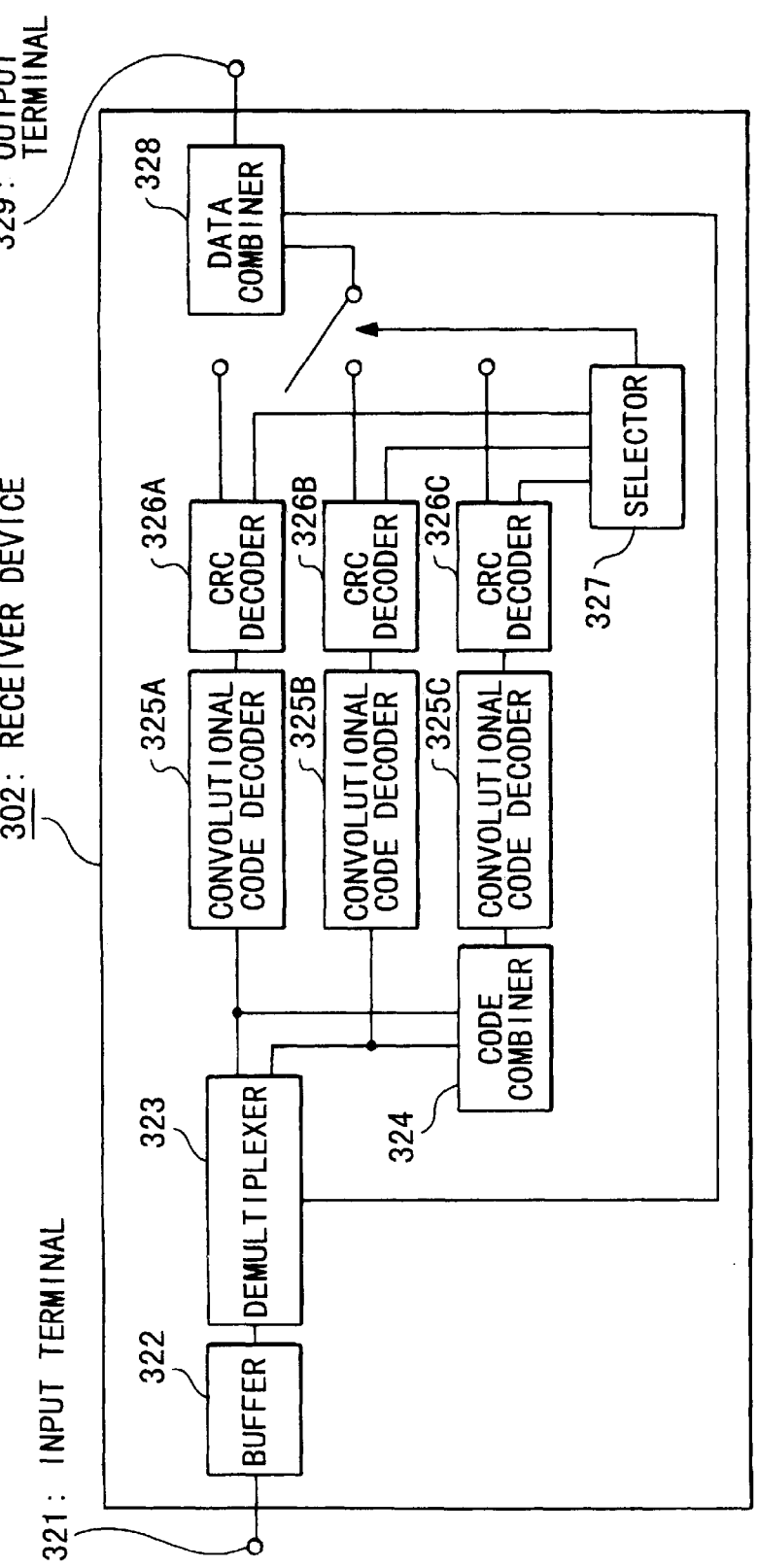
FIG. 8 is a block diagram showing the configuration of a receiver device of the data transmission device according to the third preferred embodiment.
Figure 9:
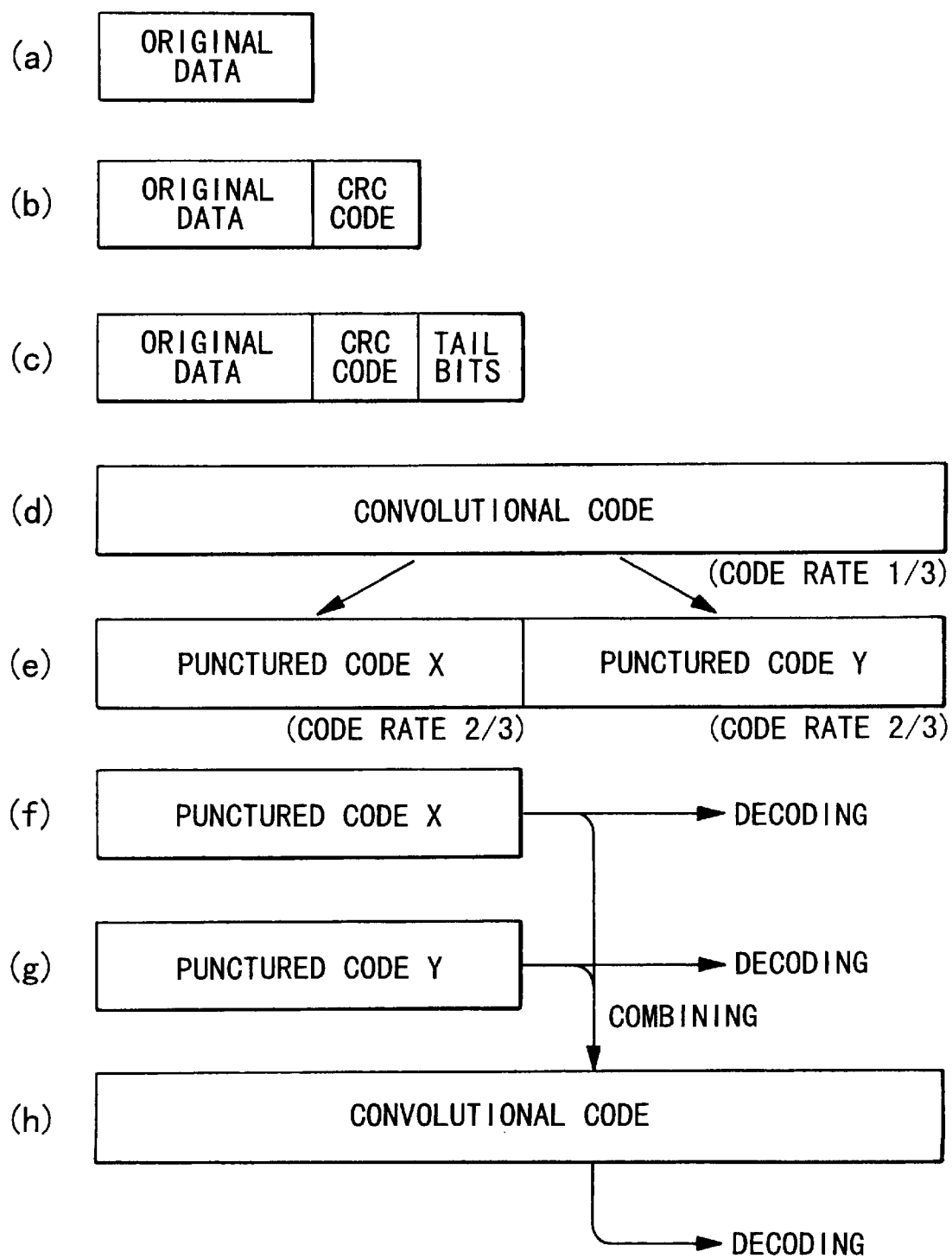
FIG. 9 shows data processing carried out in some sections of the transmitter device and of the receiver device.

FIG. 7 is a block diagram showing the configuration of a transmitter device 301 of a data transmission device according to a third preferred embodiment of the present invention. FIG. 8 is a block diagram showing the configuration of a receiver device 302 of the data transmission device. FIG. 9 shows data processing carried out in some sections of the transmitter device 301 and of the receiver device 302.

First of all, the description will be given with respect to the transmitter device 301. Like the first preferred embodiment, a data inputted through an input terminal 311 is supplied to a data separator 313 via a buffer 312 coding unit by coding unit. The data thus supplied is divided into a data requiring protection against code error and a data requiring no protection based on the importance of each part of the data. The data requiring protection is supplied to a CRC coder 314 as an original data, as shown in the illustration (a) of FIG. 9. The data requiring no protection is supplied to a multiplexer 318.

The original data is added with a CRC code for error detection, as shown in the illustration (b) of FIG. 9, by the CRC coder 314, and further added with tail bits for termination of convolutional coding, as shown in the illustration (c) of FIG. 9 by a tail bit adder 315. Like the first preferred embodiment, these tail bits have bit length corresponding to restrictional length of convolutional coding carried out by a convolutional coder 316 which is placed on the output side of the tail bit adder 315.

The convolutional coder 316 carries out error correction coding at a redundancy code rate of $\frac{1}{3}$ on the data supplied from the tail bit adder 315. More specifically, the convolutional coder 316 in the preferred embodiment carries out convolution using a generation polynomial expression on the data supplied from the tail bit adder 315 to generate a convolutional code having a redundancy code rate of $\frac{1}{3}$, as shown in the illustration (d) of FIG. 9.

A code divider 317 divides the convolutional code thus generated by the convolutional coder 316 by two to generate two punctured codes X and Y having a redundancy code rate of $\frac{2}{3}$, as shown in the illustration (e) of FIG. 9. Punctured code is an error correction code which is generated by rejecting a part of a convolutional code. In transmission of such a punctured code, redundancy and error correction ability of the transmission can be controlled by changing the rejected part of the convolutional code. In this preferred embodiment, a part of original convolutional code is selected from the original code as a punctured convolutional code X, and a code different from the punctured convolutional code X is selected from the original code as a punctured convolutional code Y. Each one of the punctured codes X and Y has error correction ability. Therefore, it is possible to independently decode the original data, which has not had convolution coding, from each one of the punctured codes X and Y. In other words, the code selection for generating the punctured codes from the original convolutional code should be carried out so that the punctured codes having such an error correction ability are obtained.

The multiplexer 318 multiplexes the two coded data (punctured codes X and Y) and the data requiring no protection outputted from the data separator 313, and outputs the data thus multiplexed to a communication line via an output terminal 319. Like the first preferred embodiment, the multiplexing is carried out so that the data requiring no protection is inserted between the coded data, and the coded data are separated from each other, in a time axis not so as to meet a same burst error (refer FIG. 3).

Next, the description will be given with respect to the receiver device 302. The data outputted from the transmitter device 301 is transmitted to an input terminal 321 of the receiver device 302. The data thus transmitted is supplied to demultiplexer 323 via buffer 322 decoding unit by decoding unit, and the data is divided into the two coded data (i.e., the punctured codes X and Y) and the data requiring no protection by the demultiplexer 323. The data requiring no protection is sent to a data mixer or data combiner 328. The punctured code X is supplied to a convolutional code decoder 325A and the punctured code Y is supplied to a convolutional code decoder 325B. Furthermore, the punctured codes X and Y are supplied to a code mixer or code combiner 324.

The convolutional code decoder 325A carries out error correction decoding on the punctured code X sent from the demultiplexer 323 to generate a decoded data corresponding to the original data which has not had convolutional coding, as shown in the illustration (f) of FIG. 9. A CRC decoder 326A carries out code error detection on the decoded data based on the CRC code included in the decoded data.

Similarly, the convolutional code decoder 325B carries out error correction decoding on the punctured code Y sent from the demultiplexer 323, as shown in the illustration (g) of FIG. 9, and a CRC decoder 326B carries out code error detection on the decoded data based on the CRC code included in the decoded data.

On the other hand, the code mixer 324 mixes the punctured codes X and Y to generate a convolutional code corresponding to the original convolutional code which has not had division, as shown in the illustrations (f)–(h) of FIG. 9. A convolutional code decoder 325C carries out a decoding operation, which corresponds to the above-described generation polynomial expression used by the convolutional coder 316, on the convolutional code generated by the code mixer 324, to generate a decoded data corresponding to the original data which has not had the convolutional coding using the generation polynomial expression, as shown in the illustration (h) of FIG. 9. A CRC decoder 326C carries out code error detection on the decoded data based on the CRC code included in the decoded data. The results of code error detection of the CRC decoders 326A–326C are sent to a selector 327. The selector 327 selects one of the decoded data which is expected to have no code error or a least remaining code error based on the results of code error detection. More specifically, the selection is carried out according to the following method:

a. If the decoded data outputted from the convolutional code decoder 325A–325C include a coded data from which no code error is detected, the selector 327 selects such a decoded data having no code error and sends it to the data mixer 328.

b. If code errors are detected from all of the decoded data outputted from the convolutional code decoders 325A–325C, the selector 327 selects the decoded data outputted from the convolutional code decoder 325C and sends it to the data mixer 328, because the decoded data outputted from the convolutional code decoder 325C is obtained from the coded data having a redundancy code rate of 1/3 by error correction decoding and it is expected that the remaining error is less than the remaining errors of the other decoded data.

The data mixer 328 multiplexes the decoded data selected by the selector 327 and the data requiring no protection sent from the demultiplexer 323. The data mixer 328 then outputs the multiplexed data via an output terminal 329 as a decoded data. If the decoded data and the data requiring no protection are used by different external devices, the decoded data and the data requiring no protection may be supplied to the external devices via different output terminals.

The third preferred embodiment is as described above and the effects of the above-described first preferred embodiment are also obtained from the third preferred embodiment. The following modifications are among those available with respect to the third preferred embodiment:

(1) Like the first preferred embodiment, the selector 327 may be designed so as to not only select the decoded data from which no code error is detected, but also compare the decoded data in order to reduce the misdetection of the CRC decoders using the comparison result.

(2) The above-described third preferred embodiment discloses the example in which the transmitter device carries out error correction coding at a redundancy code rate of $1/N=1/3$ and transmits the two coded data which are obtained by dividing the coded data into two parts. That is to say, the above-described preferred embodiment discloses the example in the case of N=3 and M=2. However, it is to be understood that the preferred embodiment can be embodied with other values of other N and M.

(3) The above-described third preferred embodiment discloses the example in which the coded data is divided into the two coded data and the two coded data are transmitted. Therefore, in this disclosed example, the code mixer 324 generates a coded data capable of error correction using the two punctured codes, i.e., the all coded data transmitted from the transmitter device 301. However, in a modified example, the code mixer 324 may select plural coded data among the all coded data transmitted from the transmitter device 301, and generate a punctured code which has error correction ability higher than those of the transmitted code data. In another modified example, the code mixer 124 may generate plural punctured codes having error correction ability.

(4) The above-described third preferred embodiment discloses the example in which the coded data is divided into the two coded data having a same code length. This example may be modified so that a coded data generated by error correction coding at a redundancy code rate of 1/N is divided into M (N>M) coded data which have different code lengths, and the M coded data are transmitted. For example, if error correction coding at a redundancy code rate of 1/3 is carried out, the coded data generated by the coding is divided into a longer coded data having a twice code length of the original data and a shorter coded data having a code length equal to that of the original data, and the two coded data are transmitted from the transmitter device. In this case, if the longer data includes a code error, the code error can be corrected only using the coded data. Therefore, in the receiver device, error correction decoding is carried out on the longer coded data, and the shorter coded data is decoded when the code error of the longer coded data is a burst error and cannot be corrected. In this manner, priorities can be assigned to the divided coded data in the transmission and decoding.

Figure 23:
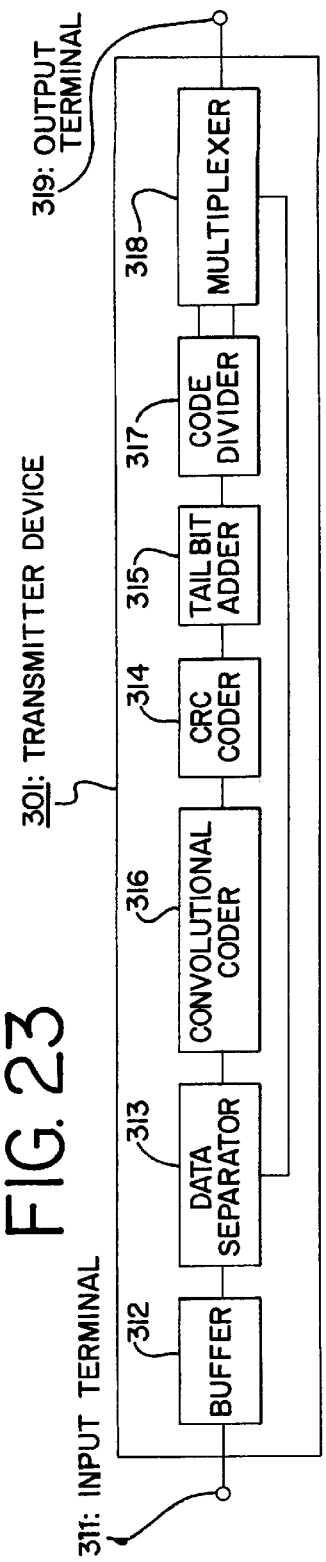
FIG. 23 is a block diagram of an alternate configuration of the embodiment shown in FIG. 7.
Figure 24:
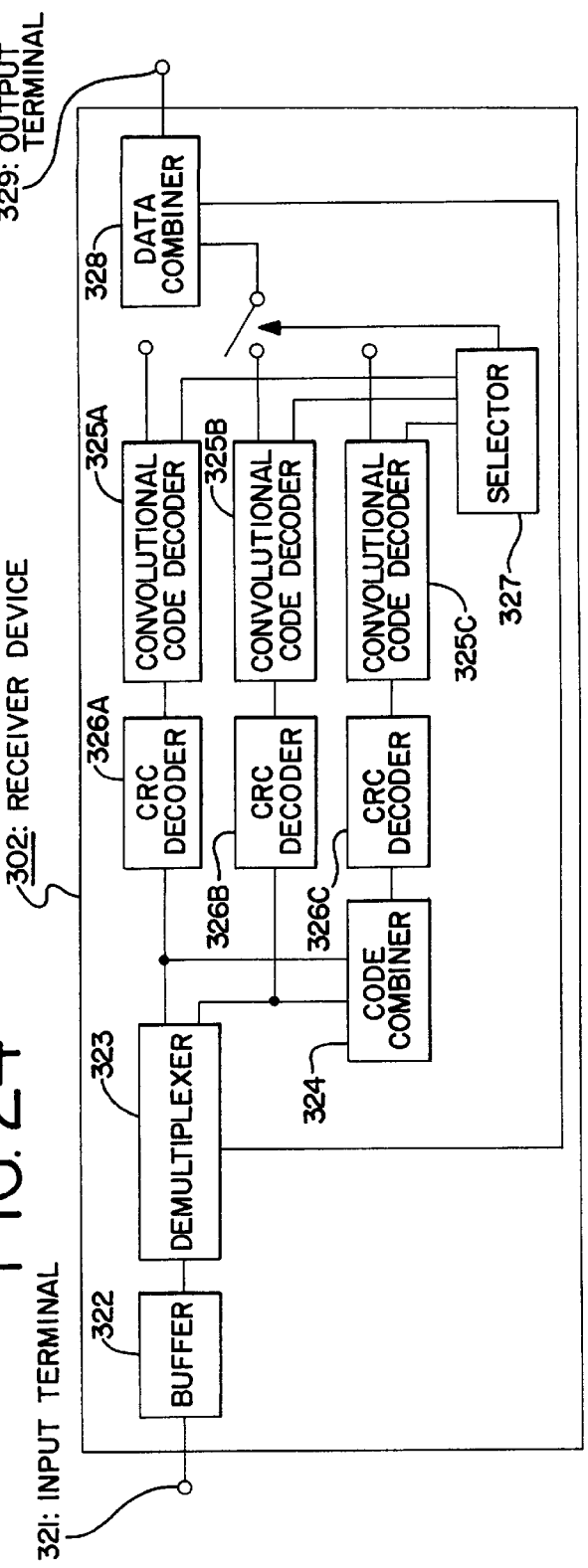
FIG. 24 is a block diagram of an alternate configuration of the embodiment shown in FIG. 8.

(5) In the transmitter device 301 of the above-described third preferred embodiment, the CRC coder 314 is placed in front of the convolutional coder 316. As shown in FIGS. 23 and 24, this embodiment may be modified so that the CRC coder is placed on the output side of the code divider and CRC codes are added to the two coded data obtained from the code divider. In this modification, the error detections of the two coded data are carried out based on the CRC codes included in the coded data in the receiver device. If no error is detected from any coded data, decoding is carried out on such a coded data. If errors are detected from the all coded data, an error correction coding is carried out on a coded data which is obtained by mixing the plural coded data. In this modification, quantity of operation is reduced in comparison to the case in which error correction coding of a mixed coded data is always carried out.

(6) In the above-described third preferred embodiment, a convolutional coding is used as error correction coding. However, other error correction coding, such as an invertible coding, may be used instead of the convolutional coding. The advantage of use of invertible coding has been already described with respect to the first preferred embodiment.

(7) The tail bit adder 315 may be omitted from the above-described preferred embodiment if a relative low error correction ability is required with respect to the bits placed in the vicinity of the terminal portion of the data requiring protection. In this case, the redundancy corresponding to the tail bit can be rejected.

D. Fourth Preferred Embodiment

Figure 10:
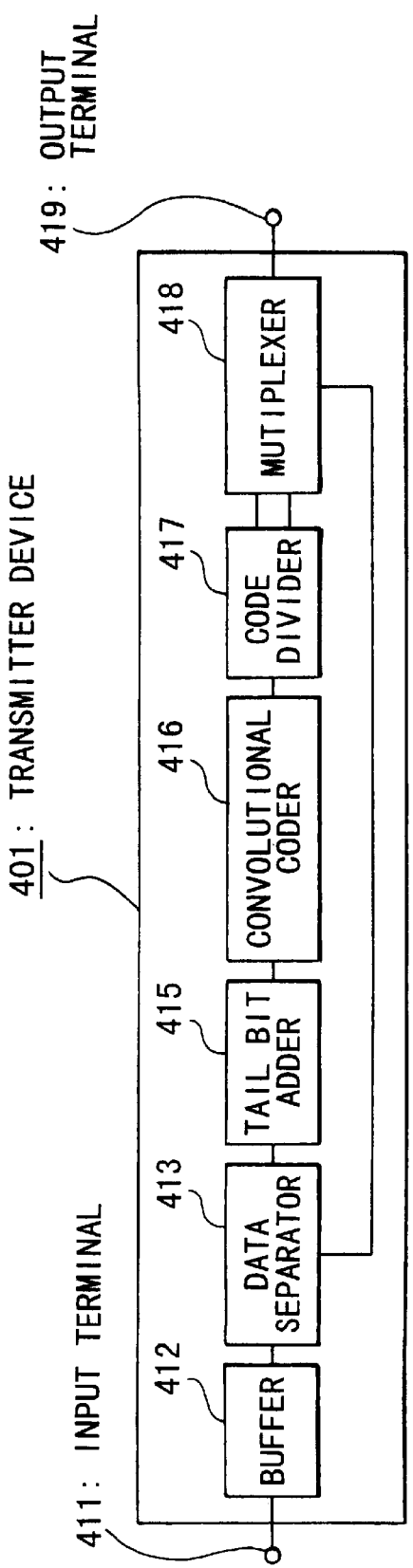
FIG. 10 is a block diagram showing the configuration of a transmitter device of a data transmission device according to a fourth preferred embodiment of the present invention.
Figure 11:
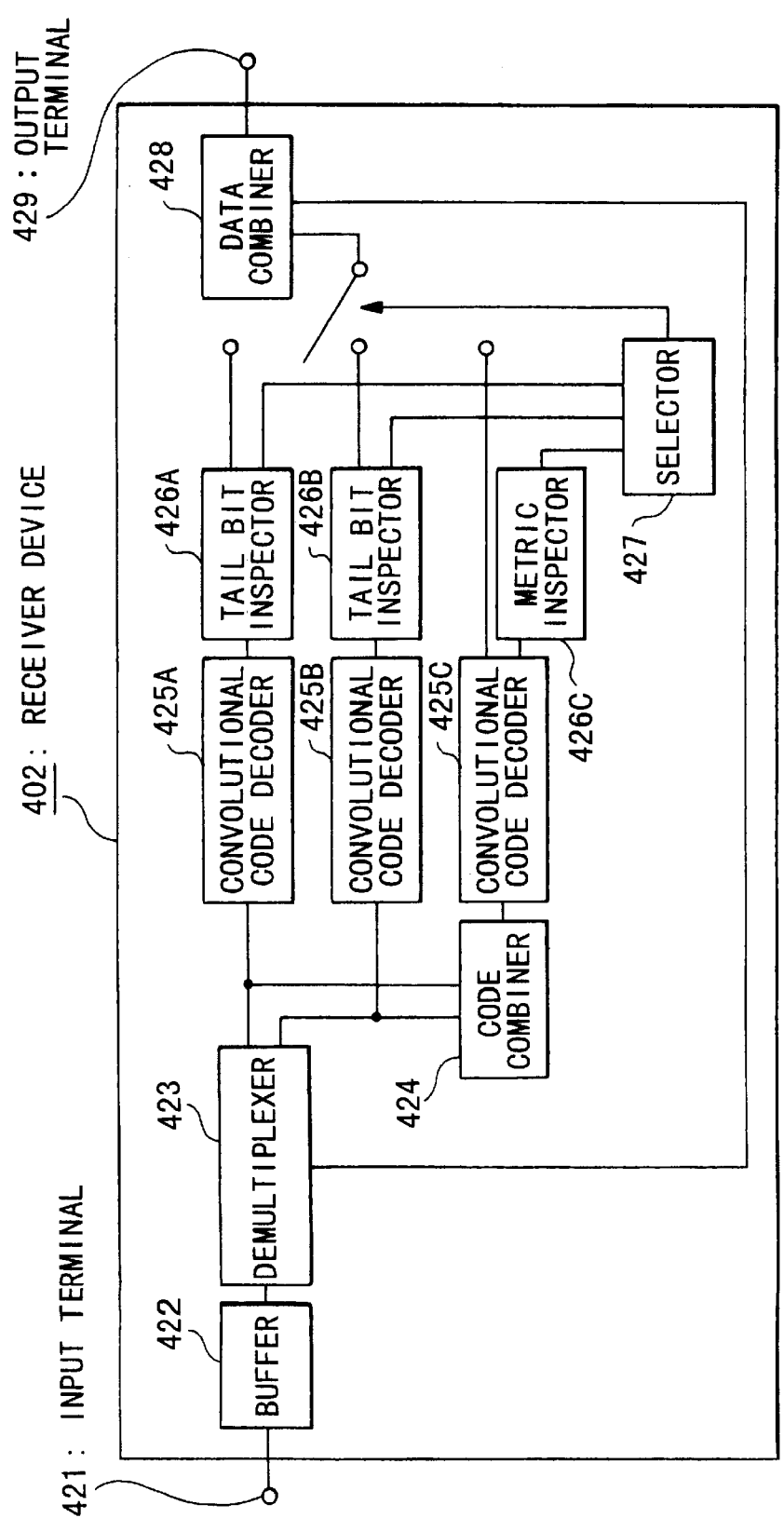
FIG. 11 is a block diagram showing the configuration of a receiver device of the data transmission device according to the fourth preferred embodiment.

FIG. 10 is a block diagram showing the configuration of a transmitter device 401 of a data transmission device according to a fourth preferred embodiment of the present invention. FIG. 11 is a block diagram showing the configuration of a receiver device 402 of the data transmission device.

As shown in FIG. 10, the transmitter device 401 is made up of an input terminal 411, a buffer 412, a data separator 413, a tail bit adder 415, a convolutional coder 416, a code divider 417, a multiplexer 418 and an output terminal 419. In the above-described third preferred embodiment, the transmitter device 301 is designed so that the original data outputted from the data separator 313 is added with a CRC code by the CRC coder 314 and the original data having the CRC code is supplied to the tail bit adder 315. In the transmitter device 401 of the fourth preferred embodiment, the original data outputted from the data separator 413 is directly supplied to the tail bit adder 415. The other elements of the configuration of the transmitter device 401 of the fourth preferred embodiment are the same as the configuration of the transmitter device 301 of the third preferred embodiment.

Next, the description will be given with respect to the receiver device 402. The data transmitted from the transmitter device 401 is transmitted to an input terminal 421 of the receiver device 402 via the communication line. This data is supplied to a demultiplexer 423 decoding unit by decoding unit via a buffer 422, and the data thus supplied is divided into two coded data and a data requiring no protection. The data requiring no protection is supplied from the demultiplexer 423 to a data multiplexer or data combiner 428. On the other hand, the two coded data, which are punctured codes X and Y protected from code error, are respectively supplied to convolutional code decoders 425A and 425B. Furthermore, the punctured codes X and Y are supplied to a code mixer or code combiner 424.

The convolutional code decoder 425A carries out error correction decoding on the punctured code X to generate a decoded data corresponding to the original data which has not had convolution. The decoded data thus generated is supplied to a tail bit inspector 426A. The tail bit inspector 426A compares tail bits which are added in the generation of the punctured code with the decoded tail bit to judge whether or not the decoded data has a code error. Similarly, the convolutional code decoder 425B carries out error correction decoding on the convolutional code Y, and a tail bit inspector 426B carries out code error detection on a decoded data outputted from the convolutional code decoder 425B by comparison of tail bits.

On the other hand, the code mixer 424 mixes the punctured codes X and Y to generate a convolutional code corresponding to the original convolutional code which has not had division. A convolutional code decoder 425C carries out a Viterbi decoding on the convolutional code thus generated by the code mixer 424 to generate a decoded data corresponding to the original data which has not had convolution coding. A metric inspector 426C compares a metric of remaining path, which is calculated in the decoding by the convolutional code decoder 425C, with a predetermined reference value to carry out error detection of the decoded data generated by the convolutional code decoder 425C.

A selector 427 selects one of the decoded data which is expected to have no code error, or a least remaining code error based on the results of code error detection of the tail bit inspectors 426A and 426B and of the metric inspector 426C, according to the method as described in the second preferred embodiment.

A data mixer or data combiner 428 multiplexes the decoded data selected by the selector 427 and the data requiring no protection sent from the demultiplexer 423, and outputs the data thus multiplexed as a decoded data via an output terminal 429.

As described above, error detection of the decoded data is carried out using the tail bits which are added in the error correction coding and the metric which is calculated in the error correction decoding. Therefore, it is not necessary to add redundancy bits to the coded data for error detection. Thus, the redundancy of transmission can be reduced as described with relation to the second preferred embodiment.

In the above-described fourth preferred embodiment, error detection of the decoded data is carried out by the tail bit inspectors and the metric inspector without use of the other additional information except for the tail bit. However, this embodiment may be modified so that other error detection, such as a CRC code, is also used. This modification can improve the accuracy of error detection. Furthermore, the above-described fourth preferred embodiment may be modified by applying the modifications corresponding to the modifications (1)–(4) of the third preferred embodiment.

E. Fifth Preferred Embodiment

Figure 12:
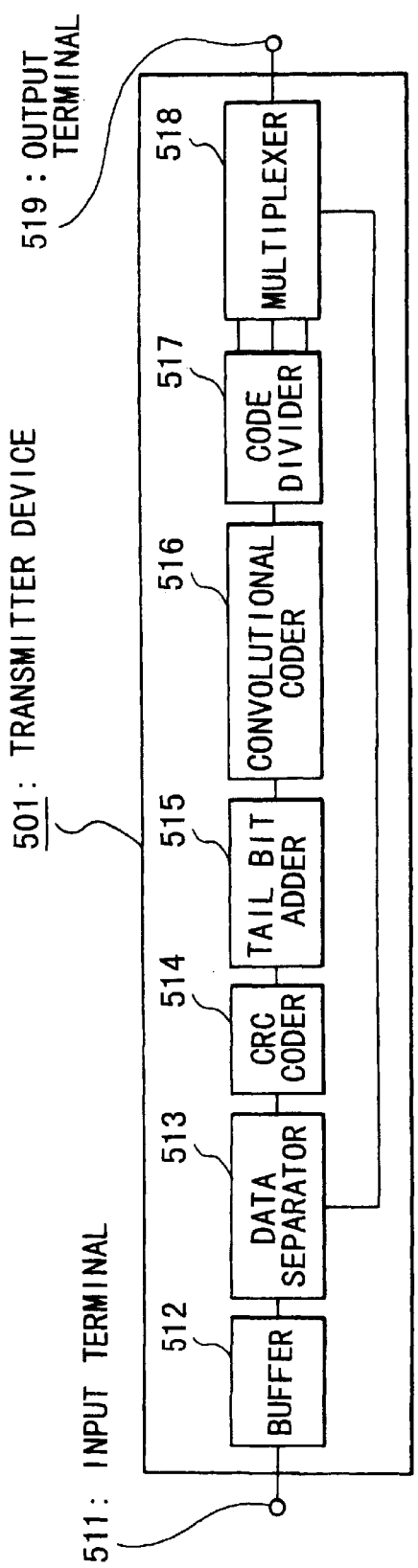
FIG. 12 is a block diagram showing the configuration of a transmitter device of a data transmission device according to a fifth preferred embodiment of the present invention.
Figure 13:
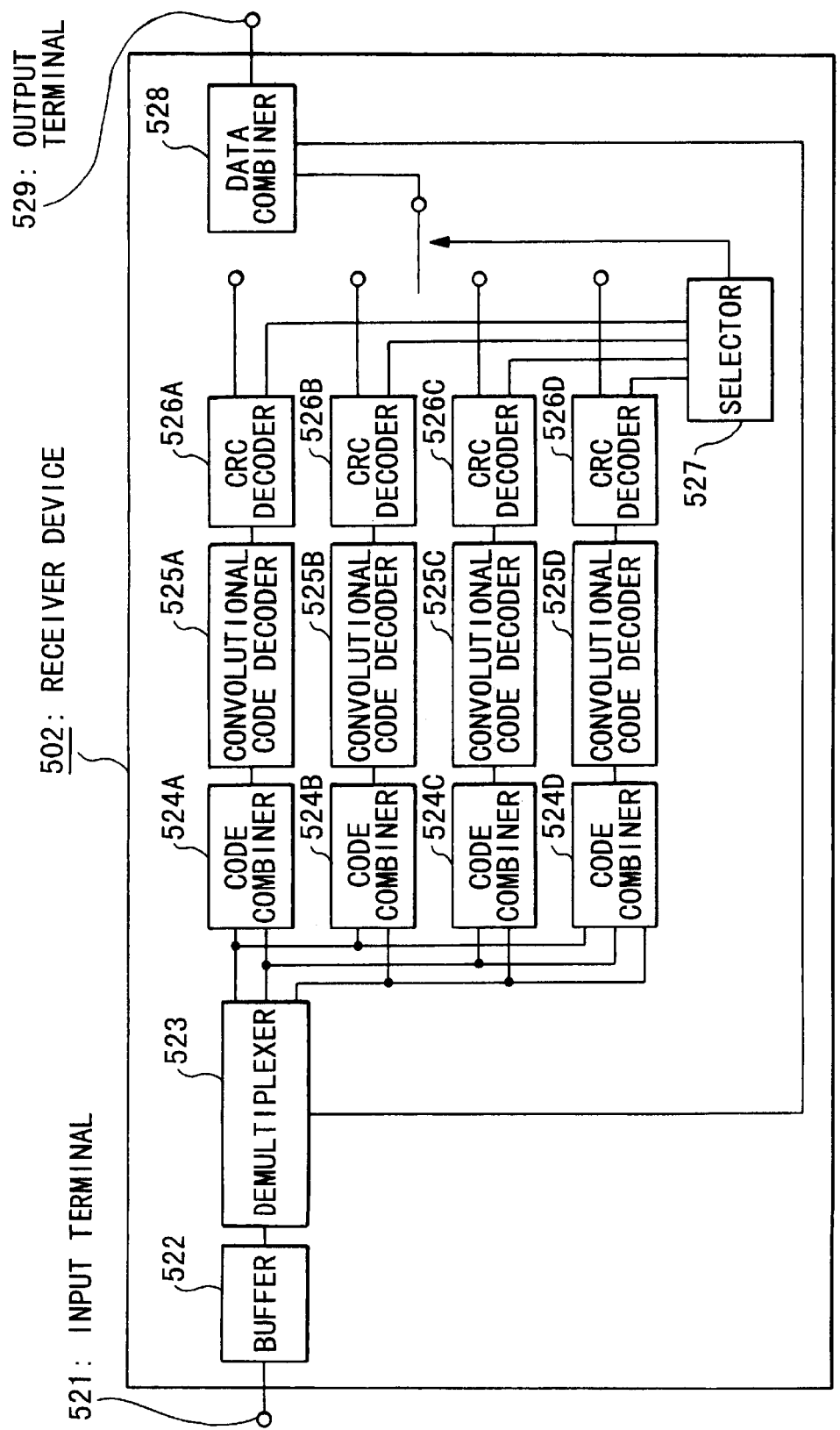
FIG. 13 is a block diagram showing the configuration of a receiver device of the data transmission device according to the fifth preferred embodiment.
Figure 14:
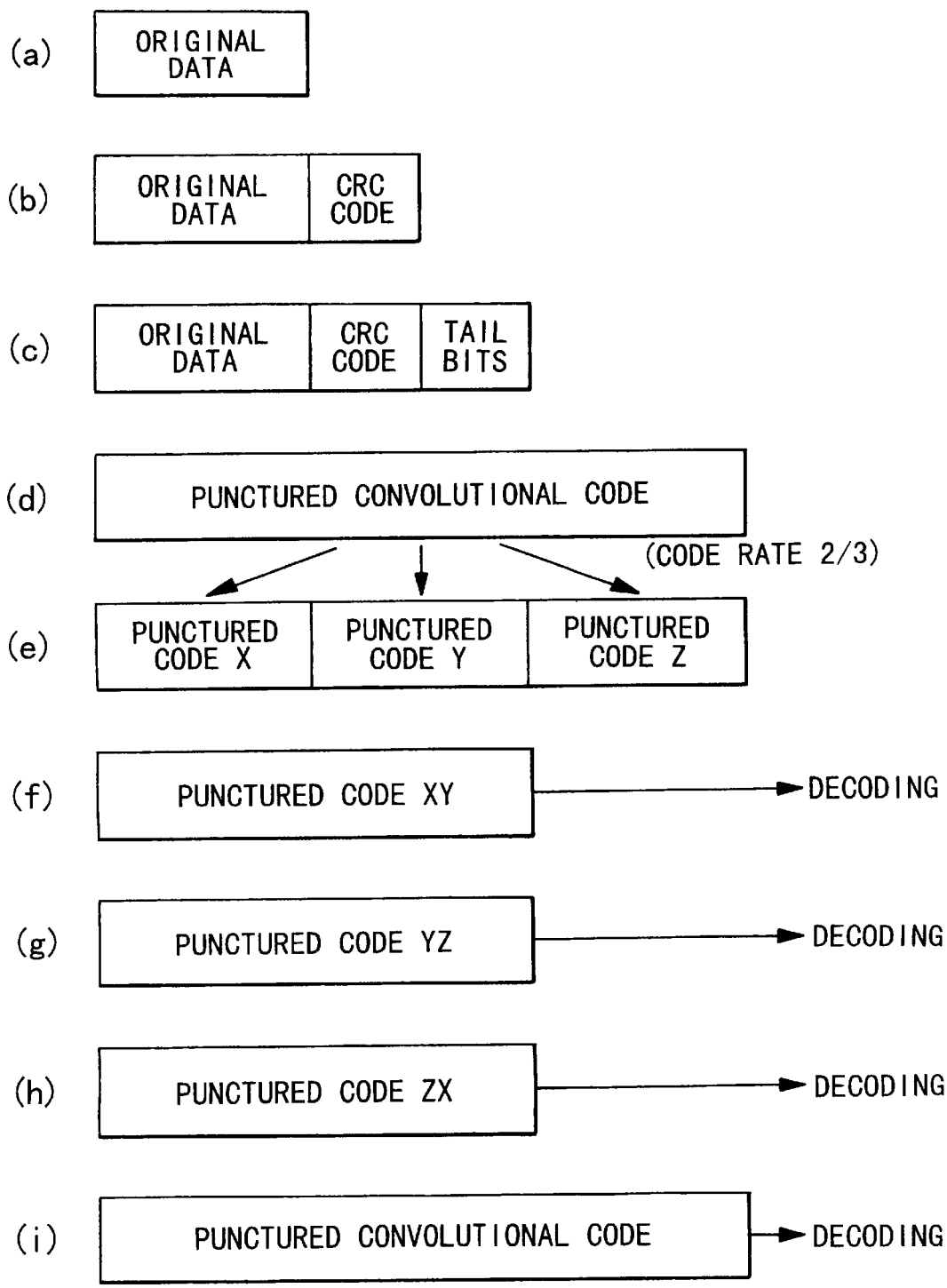
FIG. 14 shows data processing carried out in some sections of the transmitter device and of the receiver device.

FIG. 12 is a block diagram showing the configuration of a transmitter device 501 of a data transmission device according to a fifth preferred embodiment of the present invention. FIG. 13 is a block diagram showing the configuration of a receiver device 502 of the data transmission device. FIG. 14 shows data processing carried out in some sections of the transmitter device 501 and of the receiver device 502.

First of all, the description will be given with respect to the transmitter device 501. A data inputted through an input terminal 511 is supplied to a data separator 513 via a buffer 512 coding unit by coding unit. The data thus supplied is divided into a data requiring protection and a data requiring no protection based on the importance of each part of the data. The data requiring protection is supplied to a CRC coder 514 as an original data, as shown in the illustration (a) of FIG. 14. The data requiring no protection is supplied to a multiplexer 518.

The original data is added with a CRC code for error detection, as shown in the illustration (b) of FIG. 14 by the CRC coder 514, and further added with tail bits for termination of convolutional coding, as shown in the illustration (c) of FIG. 14 by a tail bit adder 515. These tail bits have bit length corresponding to restrictional length of convolutional coding carried out by a convolutional coder 516.

The convolutional coder 516 carries out error correction coding at a redundancy code rate of ⅔ on the data supplied from the tail bit adder 515. More specifically, the convolutional coder 516 in the preferred embodiment carries out convolution on the data supplied from the tail bit adder 515 to generate a convolutional code having a redundancy code rate of ⅓, and generates a punctured convolutional code having a redundancy code rate of ⅔ based on the convolutional code, as shown in the illustration (d) of FIG. 14.

A code divider 517 divides the convolutional code thus generated by the convolutional coder 516 by three to generate three punctured codes X, Y and Z, as shown in the illustration (e) of FIG. 14. Each one of the punctured codes X, Y and Z has a shorter code length than the original data which has not had convolution. However, if generating coded data having a code length which is equal to or more than the code length of the original data by combinations of two or more convolutional codes selected from the convolutional codes X, Y and Z, i.e., combinations of X and Y, and of Y and Z, and of Z and X, and of X, Y and Z, the original data can be decoded from each one of the generated code data. In this fifth preferred embodiment, the code selection for generating the punctured codes X, Y and Z from the original convolutional code should be carried out so that the punctured codes having such an ability are obtained.

The multiplexer 518 multiplexes the three coded data (the punctured codes X, Y and Z) and the data requiring no protection outputted from the data separator 513, and outputs the data thus multiplexed to a communication line via an output terminal 519. As described with respect to the first preferred embodiment, the multiplexing is carried out so that the data requiring no protection is inserted between the coded data, and the coded data are separated from each other in a time axis not so as to meet a same burst error (refer FIG. 3).

Next, the description will be given with respect to the receiver device 502. The data outputted from the transmitter device 501 is transmitted to an input terminal 521 of the receiver device 502. The data thus transmitted is supplied to demultiplexer 523 via a buffer 522 decoding unit by decoding unit. The data is then divided into the three coded data (i.e., punctured codes X, Y and Z) and the data requiring no protection by the demultiplexer 523. The data requiring no protection is sent to a data mixer or data combiner 528. The three coded data protected from code error, i.e., the punctured convolutional codes X, Y and Z, are supplied to code mixers or code combiners 524A–524D.

The code mixer 524A mixes the punctured codes X and Y to generate a punctured code XY, and the code mixer 524B mixes the punctured codes Y and Z to generate a punctured code YZ, the code mixer 524C mixes the punctured codes Y and Z to generate a punctured code YZ, and the code mixer 524D mixes the punctured codes X, Y and Z to generate a punctured convolutional code XYZ, which is the original punctured convolutional code before the division.

A convolutional code decoder 525A carries out error correction decoding on the punctured convolutional code XY generated by the code mixer 524A to generate a decoded data corresponding to the original data before the convolutional coding, as shown in the illustration (f) of FIG. 14. Similarly, a convolutional code decoder 525B carries out error correction decoding on the punctured code YZ generated by the code mixer 524B to generate a decoded data corresponding to the original data before the convolutional coding, as shown in the illustration (g) of FIG. 14. A convolutional code decoder 525C carries out error correction decoding on the punctured code ZX generated by the code mixer 524C to generate a decoded data corresponding to the original data before the convolutional coding, as shown in the illustration (h) of FIG. 14. Furthermore, a convolutional code decoder 525D carries out error correction decoding on the punctured convolutional code XYZ generated by the code mixer 524D to generate a decoded data corresponding to the original data before the convolutional coding, as shown in the illustration (i) of FIG. 14.

CRC decoders 526A–526D respectively carry out code error detection on the decoded data obtained from the convolutional code decoders 525A–525C based on the CRC codes included in the decoded data.

The results of code error detection of the CRC decoders 526A–526D are sent to a selector 527. The selector 527 selects one of the decoded data which is expected to have no code error or a least remaining code error based on the results of code error detection. More specifically, the selection is carried out according to the following method:

a. If the coded data outputted from the convolutional code decoders 525A–525D include a coded data from which no code error is detected, the selector 527 selects such a decoded data having no code error and sends it to the data mixer 528.

b. If code errors are detected from all of the decoded data outputted from the convolutional decoding code decoder 525A–525D, the selector 527 selects the decoded data outputted from the convolutional code decoder 525D and sends it to the data mixer 528, because the decoded data outputted from the convolutional code decoder 525D is obtained from the coded data having a redundancy code rate of ⅔ and it is expected that the remaining error is less than those of the other decoded data.

The data mixer 528 multiplexes the decoded data selected by the selector 527 and the data requiring no protection sent from the demultiplexer 523 and outputs the multiplexed data via an output terminal 529 as a decoded data. If the decoded data and the data requiring no protection are used by different external devices, the decoded data and the data requiring no protection may be supplied to the external devices via different output terminals.

The fifth preferred embodiment is as described above and the effects of the above-described first preferred embodiment are also obtained from the fifth preferred embodiment. The following modifications are among those available with respect to the fifth preferred embodiment:

(1) Like the first preferred embodiment, the selector 527 may be designed so as to not only select the decoded data from which no code error is detected, but also compare the decoded data in order to reduce the misdetection of the CRC decoders using the comparison result.

(2) In the above-described preferred embodiment, the redundancy code rate of error correction decoding of the transmitter device is ⅔, and the convolutional code obtained by error correction coding is divided by three, and the three coded data thus divided are transmitted. However, in a modification, another redundancy code rate and dividing number may be selected.

(3) The above-described fifth preferred embodiment discloses the example in which the coded data is divided into the three coded data having a same code length. This example may be modified so that the coded data is divided into coded data which have different code lengths. In the general transmission of data including synchronous information, probability of generation of code error is relatively low with respect to the portion of data which is right after the synchronous information. Therefore, a modification in which a leading part of an original data which is right after the synchronous information is transmitted as coded data having a long code length and the other part is transmitted as code data having a shorter code length than that of the leading part. In another modification, the original convolutional code may be divided into a plurality of coded data having different code lengths including not only code length shorter than that of the original data but also code length equal to or more than that of the original data. In the receiver device of this modification, when a received coded data, which can be independently decoded, has no code error, the coded data is decoded and the decoded data is outputted. When a code error is detected from such a code data, a coded data and the other code data are mixed to generate a coded data having error correction ability, and error correction coding is carried out using the coded data thus generated. In this manner, priorities can be assigned to the divided coded data in the transmission and decoding. Therefore, the modification gives an advantage that effective decoding can be carried out in the receiver device.

(4) In the transmitter device 501 of the above-described fifth preferred embodiment, the CRC coder 514 is placed in front of the convolutional coder 516. As shown in FIGS. 25 and 26, this embodiment may be modified so that the CRC coder is placed on the output side of the code divider and CRC codes are added to the two coded data obtained from the code divider. In this modification, the error detections of the two coded data are carried out based on the CRC codes included in the coded data in the receiver device. If no error is detected from a coded data which can be independently decoded or a coded data obtained by mixing coded data, decoding is carried on such a coded data. If errors are detected from the all coded data, error correction coding is carried out on a coded data which is obtained by mixing coded data. In this modification, quantity of operation is reduced in comparison to the case in which error correction coding of a mixed coded data is always carried out.

(5) In the above-described fifth preferred embodiment, convolutional coding is used as error correction coding. However, the other error correction coding such as an invertible coding may be used instead of the convolutional coding.

(6) The tail bit adder 515 may be omitted from the above-described fifth preferred embodiment if a relatively low error correction ability is required with respect to the bits placed in the vicinity of the terminal portion of the data requiring protection. In this case, the redundancy corresponding to the tail bit can be rejected.

F. Sixth Preferred Embodiment

Figure 15:
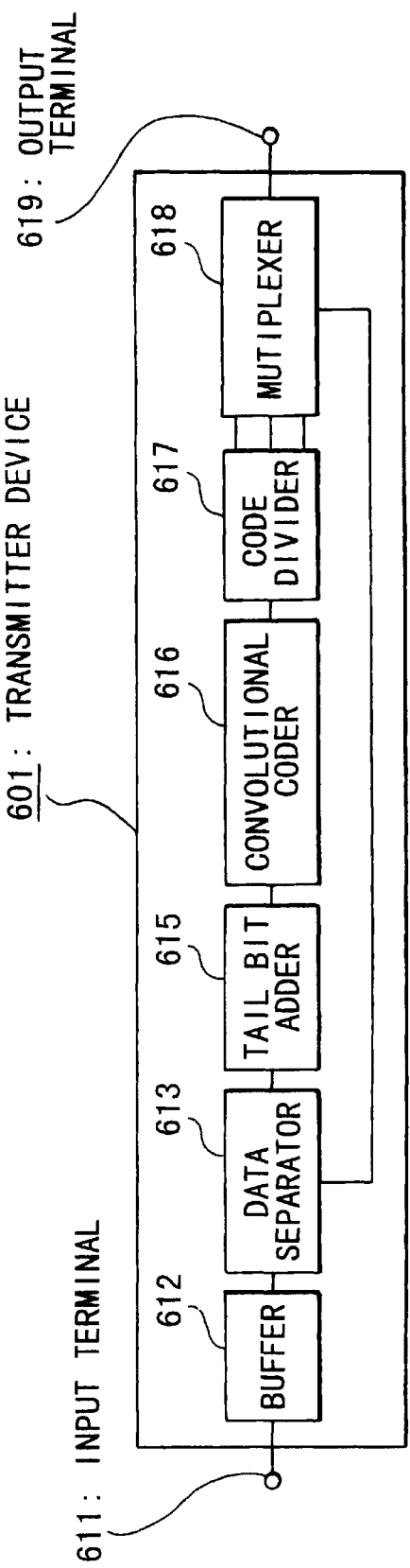
FIG. 15 is a block diagram showing the configuration of a transmitter device of a data transmission device according to a sixth preferred embodiment of the present invention.
Figure 16:
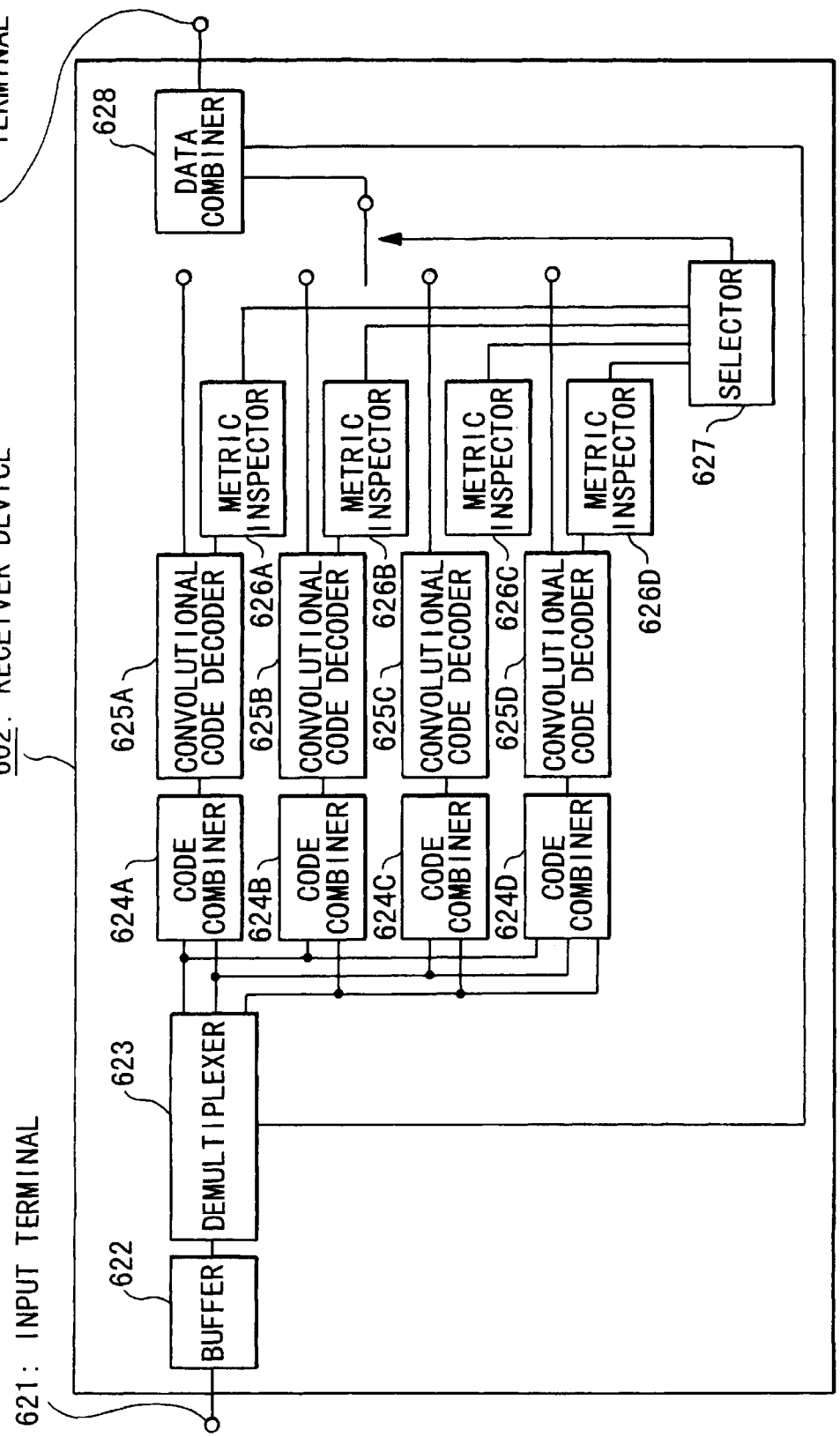
FIG. 16 is a block diagram showing the configuration of a receiver device of the data transmission device according to the sixth preferred embodiment.

FIG. 15 is a block diagram showing the configuration of a transmitter device 601 of a data transmission device according to a sixth preferred embodiment of the present invention. FIG. 16 is a block diagram showing the configuration of a receiver device 602 of the data transmission device.

As shown in FIG. 15, the transmitter device 601 is made up of an input terminal 611, a buffer 612, a data separator 613, a tail bit adder 615, a convolutional coder 616, a code divider 617, a multiplexer 618 and an output terminal 619. In the above-described fifth preferred embodiment, the transmitter device 501 is designed so that the original data outputted from the data separator 513 is added with a CRC code by the CRC coder 514 and the original data having the CRC code is supplied to the tail bit adder 515. In the transmitter device 601 of the sixth preferred embodiment, the original data outputted from the data separator 613 is directly supplied to the tail bit adder 615. The other elements of the configuration of the transmitter device 601 of the sixth preferred embodiment are the same as the configuration of the transmitter device 501 of the fifth preferred embodiment.

Next, the description will be given with respect to the receiver device 602. The data transmitted from the transmitter device 601 is transmitted to an input terminal 621 of the receiver device 602 via the communication line. This data is supplied to a demultiplexer 623 decoding unit by decoding unit via a buffer 622, and the data thus supplied is divided into three coded data and an data requiring no protection. The data requiring no protection is supplied from the demultiplexer 623 to a data multiplexer or data combiner 628. On the other hand, the three coded data, which are punctured codes X, Y and Z protected from code error, are supplied to code mixers or code combiners 624A–624D. Like the above-described fifth preferred embodiment, the code mixer 624A generates a punctured code XY using the punctured codes X and Y, and the code mixer 624B generates a punctured code YZ using the punctured codes Y and Z, and the code mixer 624C generates a punctured code ZX using the punctured codes Z and X, and the code mixer 624D generates a punctured convolutional code XYZ, which corresponds to the original convolutional code before division, using the punctured codes X, Y and Z.

The convolutional code decoders 625A–625D respectively carry out a Viterbi decoding on the punctured codes generated by the code mixers 624A–624D to respectively generate decoded data. Furthermore, the convolutional decoders 625A–625D calculate the metrics of the remaining paths in the Viterbi decoding thereof and respectively send the calculated metrics to metric inspectors 626A–626D. The metric inspectors 626A–626D respectively carry out code error detection on decoded data outputted from the convolutional decoders 625A–625D by respectively comparing the calculated metrics with a predetermined reference value.

A selector 627 selects one of the decoded data based on the results of code error detection as follows:

a. If the decoded data generated by the convolutional code decoders 625A–625D include a decoded data having no error, the selector selects such a decoded data and outputs it to a data mixer 628.

b. If code errors are detected from all coded data generated by the convolutional code decoders 625A–625D, the selector selects the decoded data generated by the convolutional code decoder 625D and outputs it to the data mixer 628.

The data mixer 628 multiplexes the decoded data selected by the selector 627 and the data requiring no protection sent from the demultiplexer 623, and outputs the data thus multiplexed as a decoded data via an output terminal 629.

As described above, error detection of the decoded data is carried out using metrics which are calculated in the error correction decoding. Therefore, it is not necessary to add redundancy bits to the coded data for error detection. Thus, the redundancy of transmission can be reduced as described above with respect to the second preferred embodiment.

This sixth preferred embodiment may be modified so that another error detection code, such as a CRC, code is also used. This modification can improve the accuracy of error detection. Furthermore, the above-described sixth preferred embodiment may be modified by applying the modifications corresponding to the modifications (1)–(3) of the fifth preferred embodiment.

G. Seventh Preferred Embodiment

In the first and second preferred embodiments, a coded data having a redundancy code rate of 1/N is divided by N and the divided coded data are transmitted as leading and trailing portions of a frame. Thus, in the case where a burst error having a long burst length (remaining time of burst error) occasionally appears, one of the divided coded data received by the receiver device may include a code error but the other divided coded data may include no code error. In such a case, it is therefore expected that accurate decoding can be carried out in the receiver device using the coded data having no code error.

However, if the first and second preferred embodiments are used in a condition in which burst errors having a short burst length appear at short intervals, such a use of the preferred embodiment increases a probability that each one of the divided coded data received by the receiver device includes a code error. In this case, each one of the divided coded data does not have error correction ability. Therefore, the receiver device cannot carry out error correction decoding independently using each one of the divided coded data. Furthermore, even if the divided coded data are mixed, the use of the mixed coded data increases a probability that the original data is not accurately decoded because the mixed coded data includes code errors which have been included in the divided coded data.

In the third and fourth preferred embodiments a coded data having a redundancy code rate of 1/N is divided by M (M<N) and therefore the code length of each one of the divided coded data is longer than the code length of the original data before the coding. Thus, in a condition in which a burst error having a long burst length occasionally appears, the use of the third and fourth preferred embodiments increases a probability that the coded data transmitted have burst errors, and therefore the transmission characteristics is not improved.

However, the coded data transmitted in the third and fourth preferred embodiments respectively have error correction ability. In the case where the preferred embodiments are used in a condition in which burst errors having a short burst length appear at short intervals, the receiver device can respectively decode the received coded data by error correction decoding using the error correction abilities of the decoded data. Even if the coded data received by the receiver device have code errors, the coded data having no code error can be obtained as long as the code errors are slight errors which can be corrected by the error correction abilities. Therefore, the third and fourth preferred embodiments are effective as means for improving the error correction ability of the communication in a condition that burst errors having a short burst length appear at short intervals.

The use of the fifth and sixth preferred embodiments provides a good transmission characteristic in a condition in which a burst error having a long burst error occasionally appears as in the first and second preferred fifth and sixth embodiments. However, if the preferred embodiments are used in a condition in which burst errors having a short burst length appear at short intervals, the transmission characteristics are not improved.

Considering the advantages and disadvantages of the above-described fifth and sixth preferred embodiments, it is effective to change the method for dividing the coded data in response to the condition of code error appearance in order to carry out high quality coding transmission in every condition.

The seventh preferred embodiment is based on the considerations described above. In the seventh preferred embodiment, in a condition in which a burst error having a long burst length appears the coded data is divided into coded data having a code length shorter than that of the original data before the coding in order to reduce the probability that the coded data transmitted include a code error. In contrast, in a condition in which burst errors having a short burst length appear, the coded data is divided into coded data having a code length longer than that of the original data before the coding so that the receiver device can decode the coded data by error correction coding using the error correction abilities of the coded data.

The seventh preferred embodiment requires means for changing the method for dividing the coded data in response to a burst length of a burst error generated in the communication line. In order to carry out the changing, it is necessary to assume a burst length of a burst error generated in the communication line. In mobile communication, a method using measurement of Doppler frequency can be used as means for assuming burst length. More specifically, it is known in mobile communication that the burst length of burst errors are in inverse proportion to Doppler frequency of a phasing generated due to the movement of a terminal equipment. Therefore, the burst length can be assumed from the measurement of Doppler frequency by using this characteristic of the mobile communication.

Figure 17:
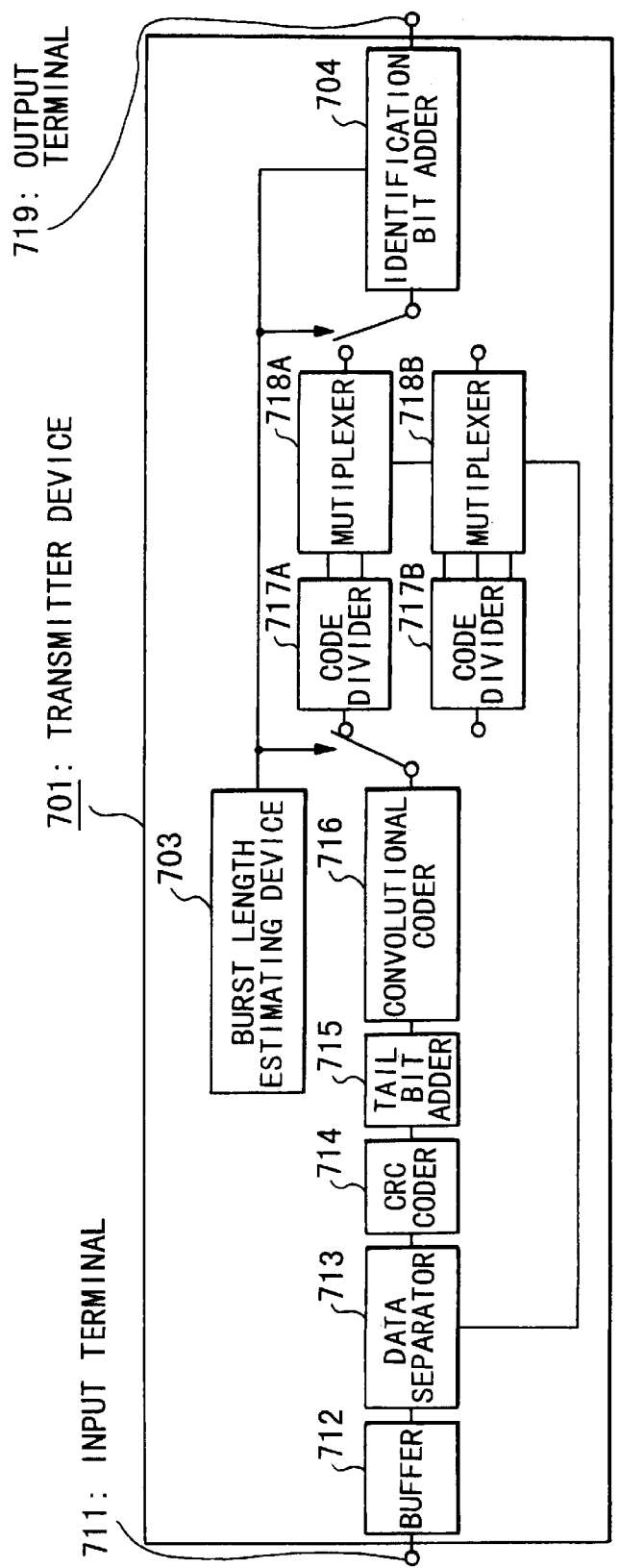
FIG. 17 is a block diagram showing the configuration of a transmitter device of a data transmission device according to a seventh preferred embodiment of the present invention.
Figure 18:
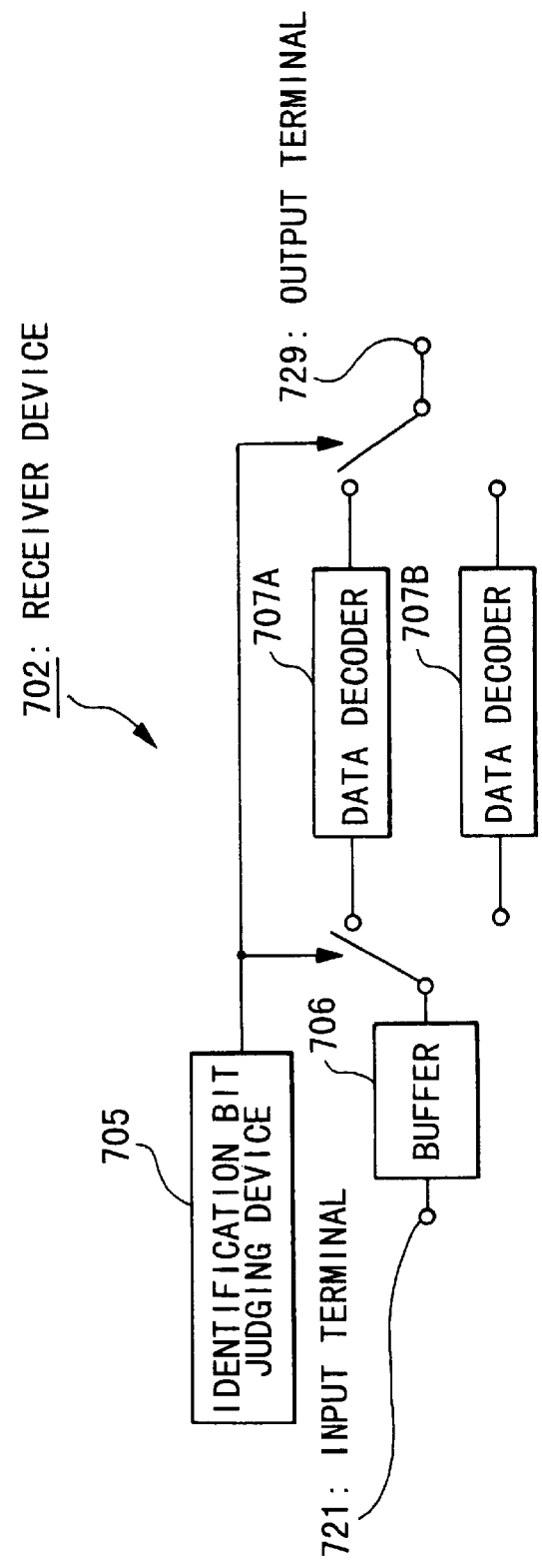
FIG. 18 is a block diagram showing the configuration of a receiver device of the data transmission device according to the seventh preferred embodiment.
Figure 19:
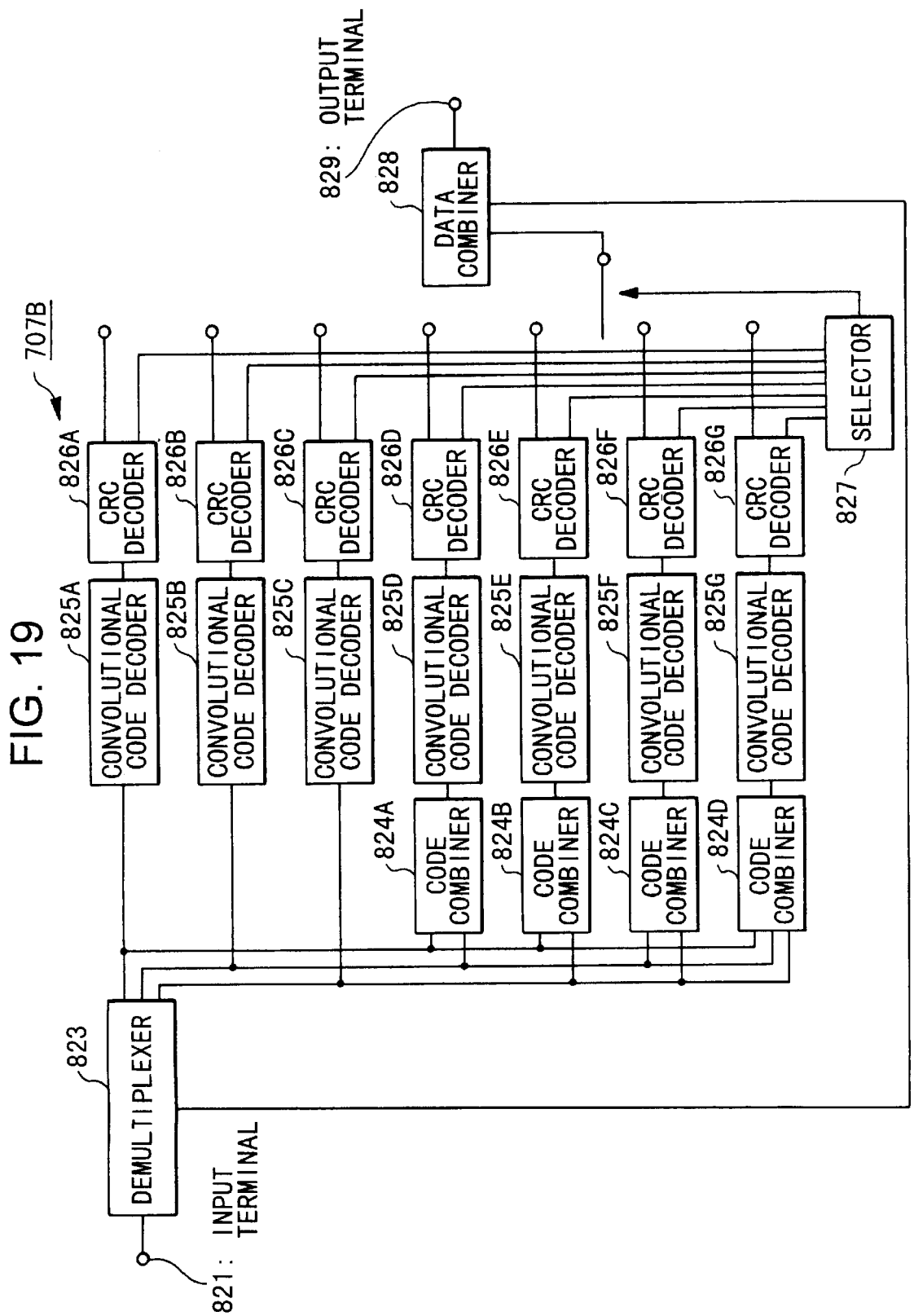
FIG. 19 is a block diagram showing the configuration of a data decoder of the receiver device.
Figure 20:
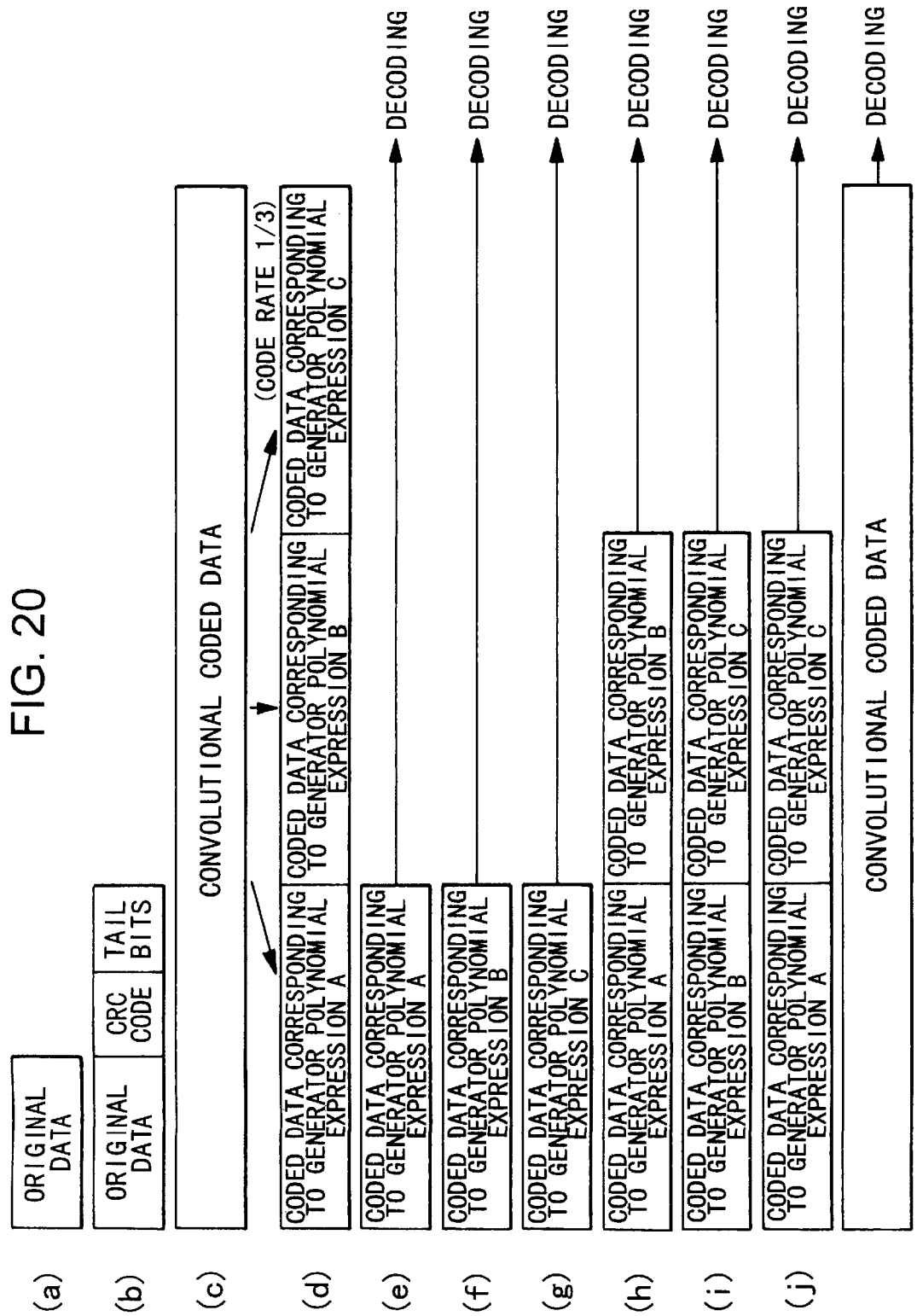
FIG. 20 shows data processing carried out in some sections of the transmitter device and of the receiver device.

FIGS. 17–20 shows the seventh preferred embodiment based on a technical thought as described above. The seventh preferred embodiment is made up by mixing the first and third preferred embodiments. FIG. 17 is a block diagram showing the configuration of a transmitter device 701 of a data transmission device according to the seventh preferred embodiment. FIG. 18 is a block diagram showing the configuration of a receiver device 702 of the data transmission device. FIG. 19 is a block diagram showing the configuration of a data decoder provided in the receiver device 702. FIG. 20 shows data processing carried out in some sections of the transmitter device 701 and of the receiver device 702.

First of all, the description will be given with respect to the transmitter device 701 with reference to FIG. 17. A data inputted through an input terminal 711 is supplied to a data separator 713 via a buffer 712 coding unit by coding unit. The data thus supplied is divided into a data requiring protection and a data requiring no protection based on the importance of each part of the data. The data requiring protection is supplied to a CRC coder 714 as an original data, as shown in the illustration (a) of FIG. 20. The data requiring no protection is supplied to multiplexers 718A and 718B.

The original data is added with a CRC code for error detection by the CRC coder 714, and further added with tail bits for termination of convolutional coding by a tail bit adder 715, as shown in the illustration (b) of FIG. 20. The tail bits has a bit length corresponding to a restrictional length of convolutional coding carried out by a convolutional coder 716.

The convolutional coder 716 carries out error correction coding at a redundancy code rate of ⅓ on the data supplied from the tail bit adder 715. As a result, a convolutional code having a redundancy code rate of ⅓ is generated by the convolutional coder 716, as shown in the illustration (c) of FIG. 20.

On the other hand, a burst length assuming device or burst length estimating device 703 assumes a burst length in a method by measurement of Doppler frequency for example. If the assumed burst length is shorter than a predetermined threshold value, the burst length assuming device 703 supplies the convolutional code generated by the convolutional coder 716 to a code divider 717A. If the assumed burst length is longer than the threshold value, the burst length assuming device 703 supplies the convolutional code to a code divider 717B.

The code divider 717A divides the input convolutional code by two. Therefore, when the burst length is short, the convolutional code having a redundancy code rate of ⅓ generated by the convolutional coder 716 is divided by two by the code divider 717A. As a result, two coded data having a redundancy code rate of ⅔ are obtained, as in the third preferred embodiment (refer the illustrations (d) and (e) of FIG. 9).

In contrast, the code divider 717B divides the input convolutional code by three. Therefore, when the burst length is long, the convolutional code having a redundancy code rate of ⅓ generated by the convolutional coder 716 is divided by three by the code divider 717B, as shown in the illustrations (c) and (d) of FIG. 20. In this manner, the convolutional code is divided into coded data having a redundancy code rate of 1, as in the first preferred embodiment.

When coded data are generated by the code divider 717A, the multiplexer 718A multiplexes the coded data thus generated with the data requiring no protection supplied from the data separator 713. Similarly, when coded data are generated by the code divider 717B, the multiplexer 718B multiplexes the coded data thus generated with the data requiring no protection supplied from the data separator 713.

When the burst length is short and the burst length assuming device 703 supplies the convolutional code to the code divider 717A, the burst length assuming device 703 reports it to an identification bit adder 704 and selects the output signal of the multiplexer 718A to supply the output signal to the identification bit adder 704. As a result, an identification bit which indicates that the convolutional code is divided by two is added with the output signal of the multiplexer 718A by the identification bit adder 704, and the output signal attaching with the identification bit is outputted to the communication line via an output terminal 719.

On the other hand, when the burst length is long and the burst length assuming device 703 supplies the convolutional code to the code divider 717B, the burst length assuming device 703 reports it to the identification bit adder 704 and selects the output signal of the multiplexer 718B to supply the output signal to the identification bit adder. As a result, an identification bit which indicates that the convolutional code is divided by three is added with the output signal of the multiplexer 718B by the identification bit adder 704, and the output signal attaching with the identification bit is outputted to the communication line via the output terminal 719.

Next, the description will be given with respect to the receiver device 702 with reference to FIG. 18. The receiver device 702 has an identification bit judging device 705, a buffer 706, and data decoders 707A and 707B.

The data outputted from the transmitter device 701 are accumulated in the buffer 706 via an input terminal 721. The accumulated data are outputted from the buffer 706 decoding unit by decoding unit. The identification bit judging device 705 judges identification bits of the data thus outputted decoding unit by decoding unit, and supplies the output data to the data decoder 707A or 707B according to the result of the judgement regarding the identification bit. That is to say, if the output data of the buffer 706 is a data obtained by dividing the convolutional code by two (i.e., the data which has had the operation by the code divider 717A), the identification bit judging device 705 supplies the data to the data decoder 707A. In contrast, if the output data of the buffer 706 is a data obtained by dividing the convolutional code by three (i.e., the data which has had the operation by the code divider 717B), the identification bit judging device 705 supplies the data to the data decoder 707B.

The data decoder 707A has the same configuration as the demultiplexer 323 and the elements following the demultiplexer of the receiver device 302 of the third preferred embodiment.

When the output data of the buffer 706 is supplied to the data decoder 707A, the data is divided into the data requiring protection and the data requiring no protection. The data requiring protection includes two coded data having a redundancy code rate of ⅔. In the data decoder 707A, error correction decoding using each one of the two coded data and error correction decoding using a mixed coded data made up of the two coded data are carried out, and the decoded data which has the least remaining error is selected and is outputted, as shown in the illustrations (f)–(h) of FIG. 9.

On the other hand, the data decoder 707B has a configuration as shown in FIG. 19. The output data of the buffer 706 is supplied to a demultiplexer 823 via an input terminal 821 and is divided into the data requiring protection and the data requiring no protection. The data requiring protection includes three coded data corresponding to generation polynomial expressions A, B and C.

Convolutional code decoders 825A–825C respectively decode the three coded data, as shown in the illustrations (e)–(g) of FIG. 20. Code mixers or code combiners 824A–824C respectively generate mixed coded data by combining two of three coded data. The convolutional code decoders 825D–825F respectively carry out error correction decoding on the mixed coded data generated by the code mixers 824A–824C, as shown in the illustrations (h)–(j) of FIG. 20. A code mixer or code combiner 824D mixes the three coded data to generate a mixed coded data. A convolutional code decoder 825G carries out error correction decoding on the mixed coded data, as shown in the illustration (k) of FIG. 20.

CRC decoders 826A–826G carry out code error detection on the decoded data generated by the convolutional code decoders 825A–825G.

A selector 827 selects one of the decoded data based on the result of the code error detection according to the same method described with respect to the first preferred embodiment, and supplies the selected decoded data to a data mixer or data combiner 828.

The data mixer 828 multiplexes the decoded data with the data requiring no protection and outputs the data thus multiplexed via an output terminal 829.

As described above, the same operation as the first preferred embodiment is carried out except for the use of the three coded data.

The identification bit judging device 705 shown in FIG. 18 selects one of the output terminals of the data decoder 707A and 707B based on the result of the judgement regarding the identification bit. As a result, the output data of the selected data decoder is outputted via an output terminal 729.

The seventh preferred embodiment is as described above using the example of the combination of the first and third preferred embodiments. However, the range of the present invention is not restricted to the above-described example, and there are modifications to the seventh preferred embodiment contemplated. For example, a data transmission device which provides the same advantage as the above-described seventh preferred embodiment can be provided by using means for dividing the coded data into coded data having a shorter code length than the code length of the original data which has not had coding, and means for dividing the coded data into coded data having a longer code length than the code length of the original data. Furthermore, in the above-described seventh preferred embodiment, the range of burst length is divided into two ranges, i.e., a shorter burst length range and a longer burst length range, and the method for dividing the coded data is selected based on the range which includes the assumed burst length. However, the range of burst length may be divided into three or more burst length ranges, and the different methods for dividing the coded data may be defined for the different burst length ranges. In this case, one of the methods corresponding to the range including the assumed burst length may be selected for dividing the coded data.

What is claimed is:

1. A data transmission device comprising:
    a transmitter device for dividing a data string to be transmitted into an original data string requiring protection against code error and a data string requiring no protection, and for carrying out an error detection code adding operation and error correction coding at a redundancy code rate of 1/N on the original data to generate a coded data string, and for dividing the coded data string by N, and for multiplexing the N divided coded data strings and the data requiring no protection to generate a multiplexed data string, and for outputting the multiplexed data string on a communication line; and
    a receiver device for receiving the multiplexed data string through the communication line, and for dividing the multiplexed data string into the N divided coded data strings and the data string requiring no protection, and for carrying out error correction decoding and code error detection on the N divided coded data strings and a mixed coded data string obtained by mixing the divided coded data to generate a plurality of decoded data strings, and for selecting one of the decoded data strings from which no code error is detected, and for outputting the selected decoded data string together with the data string requiring no protection.

2. A data transmission device according to claim 1, wherein the error correction coding comprises convolution coding.

3. A data transmission device comprising:
    a transmitter device for carrying out error correction coding at a redundancy code rate of 1/N on an original data string, which is to be transmitted, to generate a coded data string, and for dividing the coded data by N, and for adding error detection codes to the N divided coded data strings, and for outputting the N divided coded data strings having the error detection codes on a communication line; and
    a receiver device for receiving the N divided coded data strings having the error detection codes, and for carrying out error detection on the N divided coded data strings using the error detection codes, and for decoding the coded data strings from which no code error is detected, or for carrying out error correction decoding on a mixed coded data string obtained by mixing the divided coded data strings, and for outputting a decoded data string based on results of the decoding or the error correction decoding.

4. A data transmission device according to claim 3, wherein the error correction coding comprises convolution coding.

5. A data transmission device comprising:
    a transmitter device for dividing a data string to be transmitted into an original data string requiring protection against code error and a data string requiring no protection, and for carrying out error correction coding at a redundancy code rate of 1/N on the original data string to generate a coded data string, and for dividing the coded data string by N, and for adding error detection codes to the N divided coded data strings, and for multiplexing the N divided coded data strings having the error detection codes and the data requiring no protection to generate a multiplexed data string, and for outputting the multiplexed data string on a communication line; and
    a receiver device for receiving the multiplexed data string through the communication line, and for dividing the multiplexed data string into the N divided coded data strings having the error detection codes and the data string requiring no protection, and for carrying out error detection of the N divided coded data strings using the error detection codes, and for decoding the coded data strings from which no code error is detected, or for carrying out error correction decoding on a mixed coded data string obtained by mixing the divided coded data strings, and for outputting a decoded data string together with the data requiring no protection based on results of the decoding or the error correction decoding.

6. A data transmission device according to claim 5, wherein the error correction coding comprises convolution coding.

7. A data transmission device comprising:
    a transmitter device for carrying out an error detection code adding operation and error correction coding at a rate of 1/N on an original data string, which is to be transmitted, to generate a coded data string, and for dividing the coded data string by M which is less than N into M coded data strings having different code lengths, and for outputting the M divided coded data strings on a communication line; and
    a receiver device for receiving the M divided coded data strings through the communication line, and for carrying out error correction decoding and code error detection on the M divided coded data strings and mixed coded data obtained by mixing the divided coded data strings to generate a plurality of decoded data strings, and for outputting one of the decoded data strings from which no code error is detected.

8. A data transmission device according to claim 7, wherein the error correction coding comprises convolution coding.

9. A data transmission device comprising:
    a transmitter device for dividing a data string to be transmitted into an original data string requiring protection against code error and a data string requiring no protection, and for carrying out an error detection code adding operation and error correction coding at a redundancy code rate of 1/N on the original data string to generate a coded data string, and for dividing the coded data string by M which is less than N, and for multiplexing the M divided coded data strings and the data requiring no protection to generate a multiplexed data string, and for outputting the multiplexed data string on a communication line; and a receiver device for receiving the multiplexed data string through the communication line, and for dividing the multiplexed data string into the M divided coded data strings and the data string requiring no protection, and for carrying out error correction decoding and code error detection on the M divided coded data strings and a mixed coded data obtained by mixing the divided coded data strings to generate a plurality of decoded data strings, and for selecting one of the decoded data strings from which no code error is detected, and for outputting the selected decoded data string together with the data string requiring no protection.

10. A data transmission device according to claim 9, wherein the error correction coding comprises convolution coding.

11. A data transmission device according to claim 9 wherein the M coded data strings have different code lengths.

12. A data transmission device according to claim 11, wherein the error correction coding comprises convolution coding.

13. A data transmission device comprising:

a transmitter device for carrying out error correction coding at a redundancy code rate of 1/N on an original data string, which is to be transmitted, to generate a coded data string, and for dividing the coded data by M which is less than N, and for adding error detection codes to the M divided coded data strings, and for outputting the M divided coded data strings having the error detection codes on a communication line; and a receiver device for receiving the M divided coded data strings having the error detection codes, and for carrying out error detection on the M divided coded data strings using the error detection codes, and for decoding the coded data strings from which no code error is detected, or for carrying out error correction decoding on a mixed coded data string obtained by mixing the divided coded data strings, and for outputting a decoded data string based on results of the decoding or the error correction decoding.

14. A data transmission device according to claim 13, wherein the error correction coding comprises convolution coding.

15. A data transmission device according to claim 11 wherein the M coded data strings have different code lengths.

16. A data transmission device according to claim 15, wherein the error correction coding comprises convolution coding.

17. A data transmission device according to claim 16, wherein:

the error detection encoder comprises a tail bit adder, and the error detection decoder comprises a tail bit inspector.

18. A data transmission device comprising:

a transmitter device for dividing a data string to be transmitted into an original data string requiring protection against code error and a data string requiring no protection, and for carrying out error correction coding at a redundancy code rate of 1/N on the original data string to generate a coded data string, and for dividing the coded data string by M which is less than N, and for adding error detection codes to the M divided coded data strings, and for multiplexing the M divided coded data strings having the error detection codes and the data requiring no protection to generate a multiplexed data string, and for outputting the multiplexed data string on a communication line; and a receiver device for receiving the multiplexed data string through the communication line, and for dividing the multiplexed data string into the M divided coded data strings having the error detection codes and the data string requiring no protection, and for carrying out error detection of the M divided coded data strings using the error detection codes, and for decoding the coded data strings from which no code error is detected, or for carrying out error correction decoding on a mixed coded data string obtained by mixing the divided coded data strings, and for outputting a decoded data string based on results of the decoding or the error correction decoding together with the data requiring no protection.

19. A data transmission device according to claim 18, wherein the error correction coding comprises convolution coding.

20. A data transmission device according to claim 18 wherein the M coded data strings have different code lengths.

21. A data transmission device according to claim 20, wherein the error correction coding comprises convolution coding.

22. A data transmission device comprising:

a transmitter device for dividing a data string to be transmitted into an original data string requiring protection against code error and a data string requiring no protection, and for carrying out an error detection code adding operation and error correction coding on the original data string to generate a coded data string, and for dividing the coded data string into a plurality of coded data strings having a code length shorter than the original data string, and for multiplexing the divided coded data strings and the data requiring no protection to generate a multiplexed data string, and for outputting the multiplexed data string on a communication line; and a receiver device for receiving the multiplexed data string through the communication line, and for dividing the multiplexed data strings into the divided coded data strings and the data string requiring no protection, and for mixing the divided code data strings to generate a plurality of mixed coded data strings having a code length which is equal to or longer than the code length of the original data string which has not had the error correction coding, and for carrying out error correction decoding on the mixed code data strings to generate decoded data strings, and for carrying out error detection on the decoded data strings, and for outputting one of the decoded data strings together with the data string requiring no protection.

23. A data transmission device according to claim 22, wherein the error correction coding comprises convolution coding.

24. A data transmission device according to claim 22, wherein the coded data strings having different code lengths.

25. A data transmission device according to claim 24, wherein the error correction coding comprises convolution coding.

26. A data transmission device according to claim 22 wherein the plurality of coded data strings include a coded data string having a code length shorter than a code length of the original data string and a coded data string having a code length equal to or less than the code length of the original data string.

27. A data transmission device according to claim 26, wherein the error correction coding comprises convolution coding.

28. A data transmission device comprising:
a transmitter device for carrying out error correction coding on an original data string, which is to be transmitted, to generate a coded data string, and for dividing the coded data string into a plurality of coded data strings having different code lengths shorter than the original data string, and for adding error detection codes to the divided coded data strings, and for outputting the divided coded data strings on a communication line; and
a receiver device for receiving the divided coded data strings having the error detection code through the communication line, and for carrying out error detection of the divided coded data strings using the error detection codes, and for mixing the divided coded data from which no errors are detected to generate a mixed coded data string, and for decoding the mixed coded data string, or for carrying out error correction coding on a mixed data string obtained by mixing the divided coded data strings, and for outputting a decoded data string based on results of the decoding or the error correction decoding.

29. A data transmission device according to claim 28, wherein the error correction coding comprises convolution coding.

30. A data transmission device comprising:
a transmitter device for dividing a data string to be transmitted into an original data string requiring protection against code error and a data string requiring no protection, and for carrying out error correction coding on the original data string to generate a coded data string, and for dividing the coded data string into a plurality of coded data strings having different code lengths shorter than the original data string, and for adding error detection codes to the divided coded data strings, and for multiplexing the divided coded data strings having the error detection code and the data requiring no protection to generate a multiplexed data string, and for outputting the multiplexed data string on a communication line; and
a receiver device for receiving the multiplexed data string through the communication line, and for dividing the multiplexed data string into the divided coded data strings having the error detection code and the data string requiring no protection, and for carrying out error detection of the divided coded data strings using the error detection codes, and for mixing the divided coded data strings from which no code error is detected to generate a mixed coded data string, and for decoding the mixed coded data string, or for carrying out error correction decoding on a mixed coded data string obtained by mixing the divided coded data strings, and for outputting a decoded data string based on results of the decoding or the error correction decoding together with the data string requiring no protection.

31. A data transmission device according to claim 30, wherein the error correction coding comprises convolution coding.

32. A data transmission device comprising:
a transmitter device for dividing a data string to be transmitted into an original data string requiring protection against code error and a data string requiring no protection, and for carrying out error correction coding on the original data string to generate a coded data string, and for dividing the coded data string into a plurality of coded data strings which include a coded data string having a code length shorter than a code length of the original data string and a coded data string having a code length equal to or less than the code length of the original data string, and for adding error detection codes to the divided coded data strings, and for multiplexing the divided coded data strings having the error detection code and the data requiring no protection to generate a multiplexed data string, and for outputting the multiplexed data string on a communication line; and
a receiver device for receiving the multiplexed data string through the communication line, and for dividing the multiplexed data string into the divided coded data strings having the error detection code and the data string requiring no protection, and for carrying out error detection of the divided coded data strings using the error detection codes, and for mixing the divided coded data strings from which no code error is detected to generate a mixed coded data string, and for decoding the mixed coded data string, or for carrying out error correction decoding on a mixed coded data string obtained by mixing the divided coded data strings, and for outputting a decoded data string based on results of the decoding or the error correction decoding together with the data string requiring no protection.

33. A data transmission device according to claim 32, wherein the error correction coding comprises convolution coding.

34. A data transmission device comprising a transmitter device and a receiver device,
the transmitter device comprising:
a divider for dividing a data string into an original data string requiring protection against code error and a data string requiring no protection;
an error detection encoder for carrying out an error detection code adding operation on the original data string requiring protection against code error;
an error correction encoder for carrying out convolution coding on the original data string and the error detection code added by the error detection encoder;
a code divider for dividing the data string obtained from the error correction encoder to output a plurality of divided coded data strings; and
a multiplexer for multiplexing the divided coded data strings and the data string requiring no protection into a multiplexed data string and for outputting the multiplexed data string on a communication line; and
the receiver device comprising:
a demultiplexer for dividing the multiplexed data string received from the communication line into the divided coded data strings and the data string requiring no protection;
a code combiner for combining the divided code data strings to generate a mixed coded data string;
an error correction decoder for carrying out error correction decoding on the divided data strings and the mixed coded data string to generate a plurality of decoded data strings;
an error detection decoder for carrying out error detection decoding on the decoded data strings; and
a selector for selecting one of the decoded data strings from which no code error is detected.

* * * * *